(12) United States Patent
Lux et al.

(10) Patent No.: US 8,686,139 B2
(45) Date of Patent: Apr. 1, 2014

(54) ORGANIC ELECTRONIC DEVICE COMPRISING AN ORGANIC SEMICONDUCTING MATERIAL

(75) Inventors: Andrea Lux, Dresden (DE); Omrane Fadhel, Dresden (DE); Josef Salbeck, Kaufungen (DE); Manfred Kussler, Albbruck (DE)

(73) Assignee: Novaled AG, Dresden (DE)

( * ) Notice: Subject to any disclaimer, the term of this patent is extended or adjusted under 35 U.S.C. 154(b) by 0 days.

(21) Appl. No.: 13/510,032

(22) PCT Filed: Nov. 23, 2010

(86) PCT No.: PCT/EP2010/007081
§ 371 (c)(1),
(2), (4) Date: Jul. 19, 2012

(87) PCT Pub. No.: WO2011/063927
PCT Pub. Date: Jun. 3, 2011

(65) Prior Publication Data
US 2012/0283437 A1    Nov. 8, 2012

(30) Foreign Application Priority Data
Nov. 24, 2009   (EP) ..................... 09014598

(51) Int. Cl.
*C07D 487/02*    (2006.01)
(52) U.S. Cl.
USPC ....................................................... 544/251
(58) Field of Classification Search
USPC ....................................................... 544/251
See application file for complete search history.

(56) References Cited

U.S. PATENT DOCUMENTS

| | | |
|---|---|---|
| 4,164,431 A | 8/1979 | Tang |
| 4,356,429 A | 10/1982 | Tang |
| 5,093,698 A | 3/1992 | Egusa |
| 7,026,643 B2 | 4/2006 | Dimitrakopoulos et al. |
| 7,830,089 B2 | 11/2010 | Murano et al. |
| 7,858,967 B2 | 12/2010 | Pfeiffer et al. |
| 7,986,090 B2 | 7/2011 | Pfeiffer et al. |
| 8,084,766 B2 | 12/2011 | Werner et al. |
| 8,115,003 B2 | 2/2012 | Salbeck et al. |
| 2005/0146262 A1 | 7/2005 | Yamauchi et al. |
| 2006/0027834 A1 | 2/2006 | Forrest et al. |
| 2006/0033115 A1 | 2/2006 | Blochwitz et al. |
| 2006/0073658 A1 | 4/2006 | Ljungerantz et al. |
| 2006/0244370 A1 | 11/2006 | Tyan et al. |
| 2008/0182129 A1 | 7/2008 | Klubek et al. |
| 2008/0203406 A1 | 8/2008 | He et al. |
| 2008/0227979 A1 | 9/2008 | Saalbeck et al. |
| 2008/0230776 A1 | 9/2008 | Li et al. |
| 2010/0135073 A1 | 6/2010 | Lindner et al. |

FOREIGN PATENT DOCUMENTS

| | | |
|---|---|---|
| EP | 1 478 025 A2 | 11/2004 |
| EP | 1 804 308 A1 | 7/2007 |
| WO | 98/01449 A1 | 1/1998 |
| WO | 2005/109542 A1 | 11/2005 |

OTHER PUBLICATIONS

D'Andrade et al., Relationship between the Ionization and Oxidation Potentials of Molecular Organic Semiconductors, Organic Electronics, 2005, 11-20, 6.
Bard et al., Electrochemical Methods: Fundamentals and Applications, Wiley, 2000, 2.
Connelly et al., Chemical Redox Agents for Organomettalic Chemistry, Chem. Rev., 1996, 877-910, 96.
Koyama et al., Polycyclic N-Hetero Compounds. X.(1) Reactions of 1,3-Cyclohexanedione and Its Dimer with Formamide or Trisformylaminomethane, Chem. Pharm. Bull., 1976, 591-595, 24(4).
International Search Report for PCT Application No. PCT/EP2010/007081 dated Nov. 3, 2011 (2 pages).

*Primary Examiner* — Rebecca Anderson
*Assistant Examiner* — Karen Cheng
(74) *Attorney, Agent, or Firm* — Sutherland, Asbill & Brennan LLP

(57) ABSTRACT

The present invention relates to organic electronic devices that include an organic semiconducting material. The organic electronic devices may include organic light-emitting diodes, field-effect transistors, sensors, photodetectors, organic solar cells, organic thin-film transistors, organic integrated circuits, organic field-quench devices, organic light-emitting transistors, light-emitting electrochemical cells, or organic laser diodes.

7 Claims, 1 Drawing Sheet

ORGANIC ELECTRONIC DEVICE COMPRISING AN ORGANIC SEMICONDUCTING MATERIAL

CROSS-REFERENCE TO RELATED APPLICATIONS

This is a submission pursuant to 35 U.S.C. 154(d)(4) to enter the national stage under 35 U.S.C. 371 for PCT/EP2010/007081, filed Nov. 23, 2010. Priority is claimed under 35 U.S.C. 119(a) and 35 U.S.C. 365(b) to European Patent Application Number 09 014 598.8, filed. Nov. 24, 2009.

The subject matters of international application no. PCT/EP2010/007081 is expressly incorporated herein by reference.

FIELD OF THE INVENTION

The present invention relates to an organic electronic device comprising an organic semiconducting material.

BACKGROUND OF THE INVENTION

Conjugated organic compounds have different applications. One important field comprises organic semiconductors. Organic semiconductors can be used to fabricate simple electronic components e.g. resistors, diodes, field effect transistors, and also optoelectronic components like organic light emitting devices (e.g. OLED), solar cells, and many others. Non-volatile and volatile, re-writable memories can be created using many different physical mechanisms, such as molecular bi-stability, ferromagnetic properties (e.g. US2006073658), ion transfer and charge wells (e.g. WO08125100). The industrial and economical significance of the organic semiconductors and their devices is reflected in the increased number of devices using organic semiconducting active layers and the increasing industry focus on the subject.

A simple OLED is demonstrated in U.S. Pat. No. 4,356, 429A. There, between conductive electrodes, two semiconductive organic layers are brought together: one transporting holes and the other one transporting electrons. The recombination of holes and electrons forms excitons in one or both of the organic layers, the excitons are eventually emitted following the spin statistics. Excitons with triplet spin can also be harvested by using the materials and techniques described in EP1705727. More elaborated OLEDs are described in EP1804309 and US2008182129.

A simple, two layer, organic solar cell is described in U.S. Pat. No. 4,164,431A. Many different solar cells use organic layers, for instance, Grätzel cells, polymer cells and small molecule solar cells. Many different approaches are tried out to increase the conversion performance; the so called bulk heterojunction solar cells have reached around 5% conversion efficiency.

Conjugated organic compounds can be small molecules, for instance monomers, or oligomers, polymers, copolymers, copolymers of conjugated and non-conjugated blocks, completely or partially cross-linked layers, aggregate structures, or brush like structures. A device made with different types of compounds, in different layers or mixed together, for example with polymer and small molecule layers, is also called a polymer—small molecule hybrid device.

Organic electronic semiconductors can be used in organic electronic devices, and in organic-inorganic hybrid devices.

Despite the large electronic gap, usually up to 3 eV, formed between the highest occupied molecular orbital (HOMO) and the lowest unoccupied molecular orbital (LUMO) of the molecule, it is normally still low enough such that both positive and negative charge carriers can be injected by special electrodes. Typical organic semiconducting compounds may have a gap that is still high enough so that the compounds are optically active.

Organic field effect transistors are explained, for example, in U.S. Pat. No. 7,026,643, US2005146262 and US2008230776. The resistance of a semiconductive layer that is contacted by two electrodes (source and drain) can be controlled by the voltage that is applied to the gate. The gate is displaced on an insulator that is displaced parallel in contact to the semiconductive layer. Various geometries can be used, such as bottom gate (on the substrate), top gate (on the opposite side of the semiconductive layer relative to the substrate) or on both sides. Many different arrangements of layers can be used such as bipolar layers, injection layer, insulating layer between electrode and semiconductive layer to lower the off current, etc.

Different functional layers in different organic semiconductor devices request a variety of special characteristics.

For instance organic thin-film transistors (OTFTs) need high mobility materials in their active channel. Transparent circuits, such as transparent OTFTs require that the high mobility organic material also comprises a wide electronic band gap; the electric injection of holes and/or electrons must be still provided.

Solar cells and OLEDs require transparent transport layers, with high conductivity. The transparency is necessary in those opto-electric devices to avoid non desired absorption of the light. These so called "window" materials can be used as transport layers, exciton or charge blocking layers. The thickness of the layers made with the window materials is used to adjust the micro cavity of the OLEDs and solar cells in such a way that the outcoupled emission of the (SLED is a maximum, and in the case of the solar cell, the absorption and respective photocurrent of the device is a maximum. The non-optically active layers of all kinds of semiconductor devices can be exchanged for window materials in order to fabricate fully transparent components and circuits (e.g US20060033115).

The functionality and nomenclature of the layers are typical as used in the field. Further explanation can be found in US2006244370.

Electronic devices also need high stability towards temperature, meaning that the intrinsic properties of the amorphous organic semiconducting materials, such as triphenyl amine derivatives, or phenantronine derivatives, must include a high glass transition temperature (Tg) and high temperature stability in the device.

The conductivity can be, for example, measured by the so-called 2-point or 4-point-method. Here, contacts of a conductive material, such as gold or indium-tin-oxide, are disposed on a substrate. Then, the thin film to be examined is applied onto the substrate, so that the contacts are covered by the thin film. After applying a voltage to the contacts the current is measured. From the geometry of the contacts and the thickness of the sample the resistance and therefore the conductivity of the thin film material can be determined. The four point or two point method give the same conductivity values for doped layers since the doped layers grant a good ohmic contact.

The temperature stability can be also measured with that method in that the (undoped or doped) layer is heated stepwise, and after a waiting period the conductivity is measured.

The maximum temperature, which can be applied to the layer without loosing the desired semiconducting properties, is then the temperature just before the conductivity breaks down. For example, a doped layer can be heated on the substrate with two electrodes, as disclosed above, in steps of 1° C., wherein after each step there is a waiting period of 10 seconds. Then the conductivity is measured. The conductivity changes with temperature and breaks down abruptly at a particular temperature. The temperature stability is therefore the temperature up to which the conductivity does not break down abruptly. The measurement is performed in vacuum.

The properties of the many different used materials can be described by the position of their highest occupied molecular orbital energy level (HOMO, synonym of ionization potential), and the lowest unoccupied molecular orbital energy level (LUMO, synonym of electron affinity).

A method to determine the ionization potentials (IP) is the ultraviolet photo spectroscopy (UPS). It is usual to measure the ionization potential for solid state materials; however, it is also possible to measure the IP in the gas phase. Both values are differentiated by their solid state effects, which are, for example the polarization energy of the holes that are created during the photo ionization process. A typical value for the polarization energy is approximately 1 eV, but larger discrepancies of the values can also occur. The IP is related to beginning of the photoemission spectra in the region of the large kinetic energy of the photoelectrons, i.e. the energy of the most weakly bounded electrons. A related method to UPS, the inverted photo electron spectroscopy (IPES) can be used to determine the electron affinity (EA). However, this method is less common. Electrochemical measurements in solution are an alternative to the determination of solid state oxidation (Eox) and reduction (Ered) potential. An adequate method is for example the cyclo-voltammetry. Empiric methods for the extraction of the solid state ionization potentials are known from the literature. There are no known empiric equations for the conversion of reduction potentials into electron affinities. The reason for that is the difficulty of the determination of the electron affinity. Therefore, a simple rule is used very often: IP=4.8 eV+e*Eox (vs. Ferrocen/Ferrocenium) and EA=4.8 eV+e*Ered (vs. Ferrocen/Ferrocenium) respectively (see B. W. Andrade, Org. Electron. 6, 11 (2005) and Refs. 25-28 therein). Processes are known for the correction of the electrochemical potentials in the case other reference electrodes or other redox pairs are used (see A. J. Bard, L. R. Faulkner, "Electrochemical Methods: Fundamentals and Applications", Wiley, 2. Ausgabe 2000). The information about the influence of the solution used can be found in N. G. Connelly et al., Chem. Rev. 96, 877 (1996). It is usual, even if not exactly correct to use the terms "energy of the HOMO" E(HOMO) and "energy of the LUMO" E(LUMO) respectively as synonyms for the ionization energy and electron affinity (Koopmans Theorem). It has to be taken in consideration, that the ionization potentials and the electron affinities are given in such a way that a larger value represents a stronger binding of a released or respectively of an absorbed electron. The energy scale of the molecular orbitals (HOMO, LUMO) is opposed to this. Therefore, in a rough approximation, is valid: IP=-E(HOMO) and EA=-E(LUMO). The given potentials correspond to the solid-state potentials. Hole transport layers, including the respective blockers, mostly have HOMO in the range from 4.5 to 5.5 eV (below the vacuum level) and LUMO in the range of 1.5 eV to 3 eV. The HOMO levels of the emitter materials are in the range of 5 eV to 6.5 eV, and the LUMO in the range from 2 to 3 eV. Electron transport materials, including their respective blockers, have their HOMO in a range of 5.5 eV to 6.8 eV and LUMO in the range of 2.3 eV to 3.3 eV, larger (lower laying) LUMO and HOMO levels may be required for solar cells. The work function of the contact materials is around 4 to 5 eV for the anode and 3 to 4.5 eV for the cathode.

The performance characteristics of (opto)electronic multi-layered components are determined by the ability of the layers to transport the charge carriers, amongst others. In the case of light-emitting diodes, the ohmic losses in the charge transport layers during operation are associated with their conductivity. The conductivity directly influences the operating voltage required and also determines the thermal load of the component. Furthermore, depending on the charge carrier concentration in the organic layers, bending of the band in the vicinity of a metal contact results which simplifies the injection of charge carriers and can therefore reduce the contact resistance. Similar deliberations in terms of organic solar cells also lead to the conclusion that their efficiency is also determined by the transport and extraction to the electrode properties of charge carriers.

By electrically doping hole transport layers with a suitable acceptor material (p-doping) or electron transport layers with a donor material (n-doping), respectively, the density of charge carriers in organic solids (and therefore the conductivity) can be increased substantially. Additionally, analogous to the experience with inorganic semiconductors, applications can be anticipated which are precisely based on the use of p- and n-doped layers in a component and otherwise would be not conceivable. The use of doped charge-carrier transport layers (p-doping of the hole transport layer by admixture of acceptor-like molecules, n-doping of the electron transport layer by admixture of donor-like molecules) in organic light-emitting diodes is described in US2008203406 and U.S. Pat. No. 5,093,698.

US2008227979 discloses in detail the doping of organic transport materials, also called matrix, with inorganic and with organic dopants. Basically, an effective electronic transfer occurs from the dopant to the matrix increasing the Fermi level of the matrix. For an efficient transfer in a p-doping case, the LUMO energy level of the dopant must be lower laying or at least slightly higher, not more than 0.5 eV, to the HOMO energy level of the matrix. For the n-doping case, the HOMO energy level of the dopant must be higher laying or at least slightly lower, not lower than 0.5 eV, to the LUMO energy level of the matrix. It is furthermore desired that the energy level difference for energy transfer from dopant to matrix is smaller than +0.3 eV.

The dopant donor is a molecule or a neutral radical or combination thereof with a HOMO energy level (ionization potential in solid state) lower than 3.3 eV, preferably lower than 2.8 eV, more preferably lower than 2.6 eV and its respective gas phase ionization potential is lower than 4.3 eV, preferably lower than 3.8 eV, more preferably lower than 3.6 eV. The HOMO of the donor can be estimated by cyclo-voltammetric measurements. An alternative way to measure the reduction potential is to measure the cation of the donor salt. The donor has to exhibit an oxidation potential that is smaller than or equal to −1.5 V vs Fc/Fc+ (Ferrum/Ferrocenium redox-pair), preferably smaller than −1.5 V, more preferably smaller than or equal to approximately −2.0 V, even more preferably smaller than or equal to −2.2 V. The molar mass of the donor is in a range between 100 and 2000 g/mol, preferably in a range from 200 and 1000 g/mol. The molar doping concentration is in the range of 1:10000 (dopant molecule: matrix molecule) and 1:2, preferably between 1:100 and 1:5, more preferably between 1:100 and 1:10. In individual cases doping concentrations larger than 1:2 are applied, e.g. if large conductivities are required. The donor can be created by a precursor during the layer forming (deposition) process or during a subsequent process of layer formation (see DE 10307125.3). The above given value of the HOMO level of the donor refers to the resulting molecule or molecule radical.

A dopant acceptor is a molecule or a neutral radical or combination thereof with a LUMO level larger than 4.5 eV, preferably larger than 4.8 eV, more preferably larger than 5.04 eV. The LUMO of the acceptor can be estimated by cyclovoltammetric measurements. The acceptor has to exhibit a reduction potential that is larger than or equal to approximately −0.3 V vs Fc/Fc+ (Ferrum/Ferrocenium redox-pair), preferably larger than or equal to 0.0 V, preferably larger than or equal to 0.24 V. The molar mass of the acceptor is preferably in the range of 100 to 2000 g/mol, more preferably between 200 and 1000 g/mol, and even more preferably between 300 g/mol and 2000 g/mol. The molar doping concentration is in the range of 1:10000 (dopant molecule:matrix molecule) and 1:2, preferably between 1:100 and 1:5, more preferably between 1:100 and 1:10. In individual cases doping concentrations larger than 1:2 are applied, e.g. if large conductivities are required. The acceptor can be created by a precursor during the layer forming (deposition) process or during a subsequent process of layer formation. The above given value of the LUMO level of the acceptor refers to the resulting molecule or molecule radical.

Typical examples of doped hole transport materials are: copperphthalocyanine (CuPc), which HOMO level is approximately 5.2 eV, doped with tetrafluorotetracyanoquinonedimethane (F4TCNQ), which LUMO level is about, 5.2 eV; zincphthalocyanine (ZnPc) (HOMO=5.2 eV) doped with F4TCNQ; pentacene, with its HOMO around 4.6 eV, doped with tris {2,5-bis(3,5-bis-trifluoromethyl-phenyl)thieno}[3,4-b,h,n]-1,4,5,8,9,12-hexaazatriphenylene, which has its LUMO level at about 4.6 eV; a-NPD doped with 2,2'-(perfluoronaphthalene-2,6-diylidene)dimalononitrile.

Typical examples of doped electron transport materials are: fullerene C60 doped with acridine orange base (AOB); perylene-3,4,9,10-tetracarboxylic-3,4,9,10-dianhydride (PTCDA) doped with leuco crystal violet; 2,9-di(phenanthren-9-yl)-4,7-diphenyl-1,10-phenanthroline doped with tetrakis(1,3,4,6,7,8-hexahydro-2H-pyrimido[1,2-a]pyrimidinato)ditungsten (II) (W(hpp)4); naphthalene tetracarboxylic acid di-anhydride (NTCDA) doped with 3,6-bis-(dimethylamino)-acridine; NTCDA doped with bis(ethylene-dithio)tetrathiafulvalene (BEDT-TTF).

By using the term doping it is meant electrical doping as explained above. This doping can also be called redox-doping or charge transfer doping. It is known that the doping increases the density of charge carriers of a semiconducting matrix towards the charge carrier density of the undoped matrix. An electrically doped semiconductor layer also has an increased effective mobility in comparison with the undoped semiconductor matrix.

There is a technical challenge to provide electron transport materials (ETM) and emitter host (EMH) materials that have a sufficiently low laying LUMO level so that they can be doped, and still have a high enough laying LUMO level which can efficiently transfer charge to emitter host (in case of an ETM) and transfer energy to the emitter dopant (in case of EMH). The limitation for high laying LUMO level of the ETL is given by the dopability, since the n-dopants with very high HOMO tend to be unstable; also the injection is difficult for very high LUMO of the ETL.

A technical challenge for organic solar cells is to provide electron transport materials with low laying LUMO level that can easily align with the LUMO of the heterojunction acceptor of the solar cell. Furthermore, materials are required with the low laying LUMO level and a very low laying HOMO level that can be used to block holes.

SUMMARY OF THE INVENTION

It is an object of the present invention to provide an organic electronic device comprising a specific class of functional materials which can be utilized as organic semiconducting materials to overcome the drawbacks of the prior art. Especially, an organic electronic device shall be provided comprising transparent organic semiconducting materials which are additionally thermally stable and/or dopable. Further, the organic electronic device shall comprise semiconducting materials which can be synthesized without any difficulties and do not complex any metal dopands.

This object is achieved by an organic semiconducting material comprising at least one compound according to the following formulae:

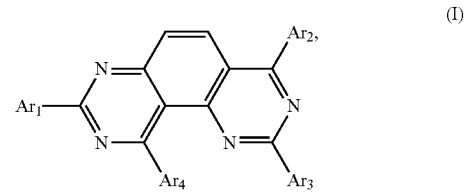

(I)

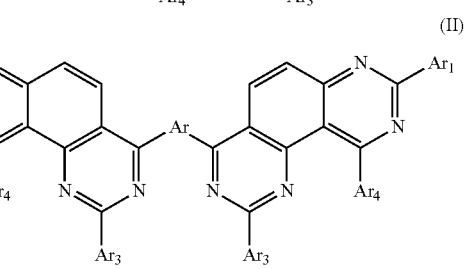

(II)

wherein Ar1, Ar2, Ar3 and Ar4 are independently selected from H, halogen, CN, substituted or unsubstituted aryl, heteroaryl, alkyl, heteroalkyl, alkoxy and aryloxy.

Ar is selected from aryl, heteroary, alky and heteroalkyl.

DETAILED DESCRIPTION

Figure 1:
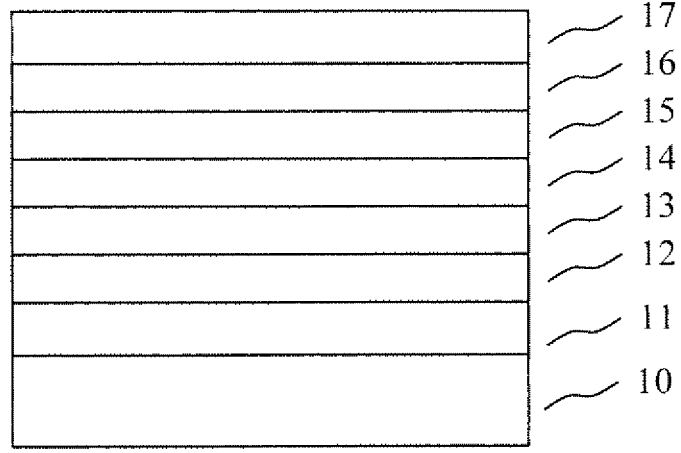
FIG. 1 shows a cross section of a typical small molecule OLED.

Preferably, the device has a layered structure and at least one layer comprises at least one compound according to the formulae as disclosed in claim 1.

In one embodiment. Ar1, Ar2, Ar3 and Ar4 are preferably independently selected from

(a1)

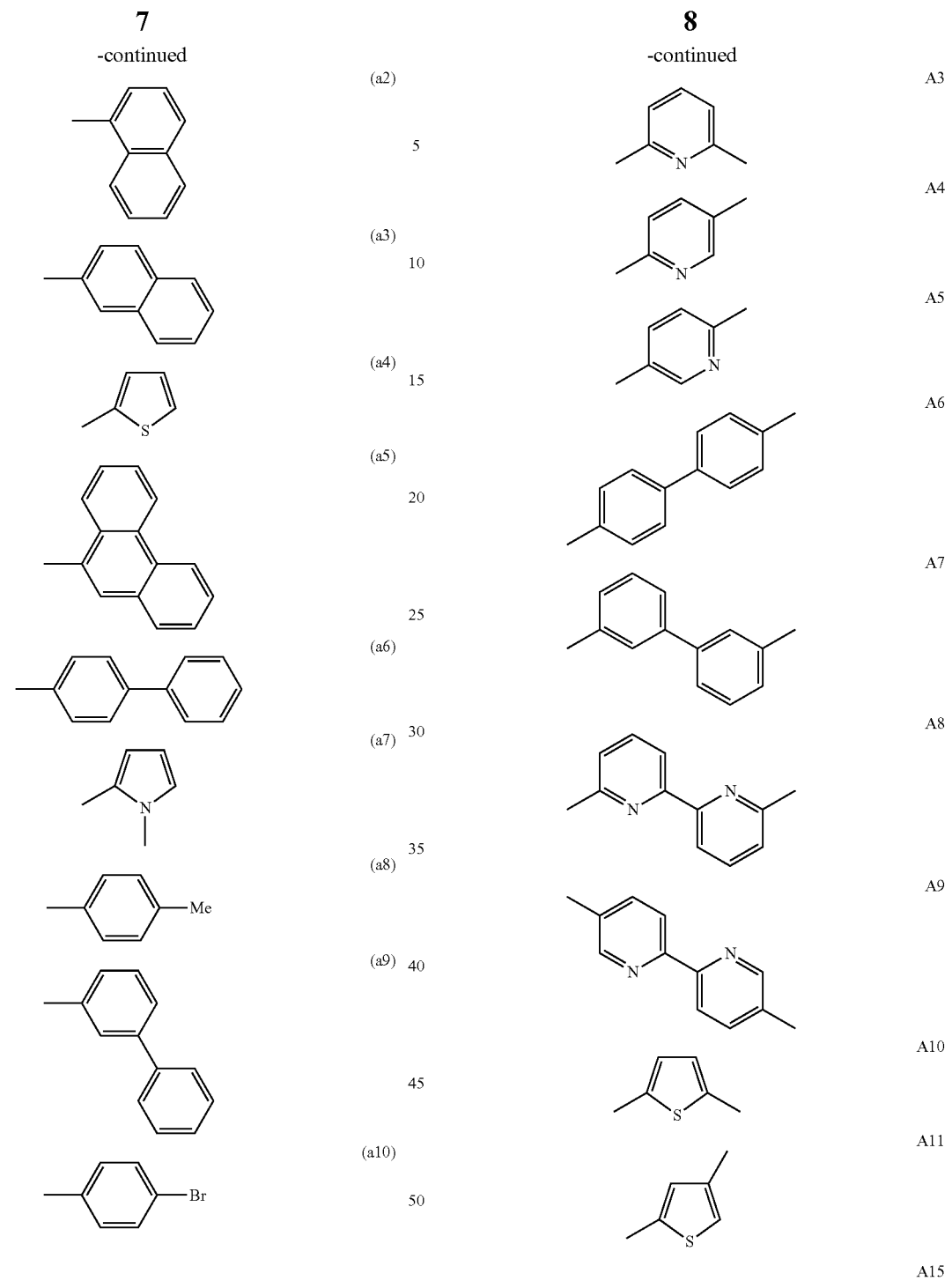
In one embodiment, Ar4 is preferably hydrogen.
In one embodiment, Ar is independently selected from
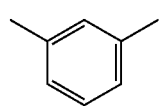
A1
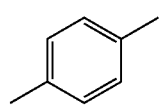
A2

-continued

A12

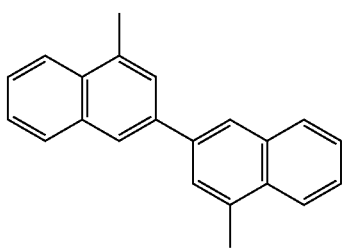

A13

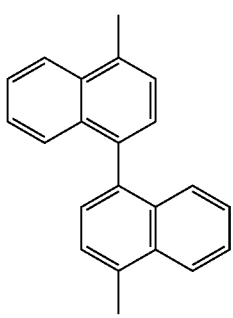

A14

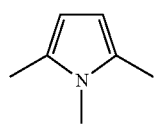

A17

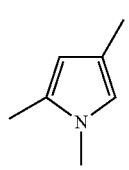

A18

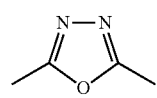

A19

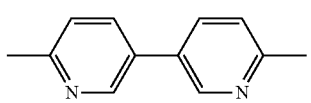

Preferably, the device is an electronic, optoelectronic or electroluminescent device having an electronically functionally effective region, wherein the electronically effective region comprises at least one compound according to the formulae of claim 1.

Furthermore, the device may be an organic light-emitting diode, a field-effect transistor, a sensor, a photodetector, an organic solar cell, an organic thin-film transistor, an organic integrated circuit, an organic field-quench device, an organic light-emitting transistor, a light-emitting electrochemical cell or an organic laser diode.

Finally, the object can be achieved by use of a compound according to the formulae (I)

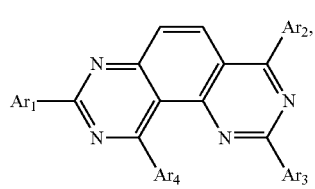

-continued (II)

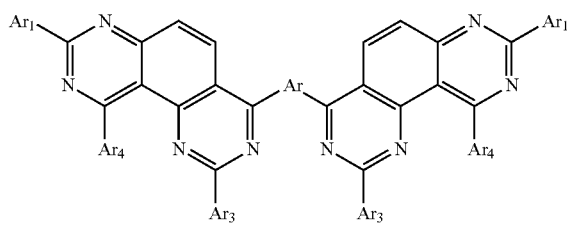

wherein Ar1, Ar2, Ar3 and Ar4 are independently selected from H, halogen, CN, substituted or unsubstituted aryl, heteroaryl, alkyl, heteroalkyl, alkoxy and aryloxy, and Ar is selected from aryl, heteroary, alky and heteroalkyl, in an organic electronic device as an optionally doped electron transport layer, an interlayer, a hole blocking layer, an optionally doped buffer layer, an emitter matrix, a semiconducting channel layer, an optionally doped injection layer, an optionally doped pn-transition for combining stacked organic electronic devices, a charge generation layer or a recombination layer.

More preferred are compounds as follows:

Structure 1

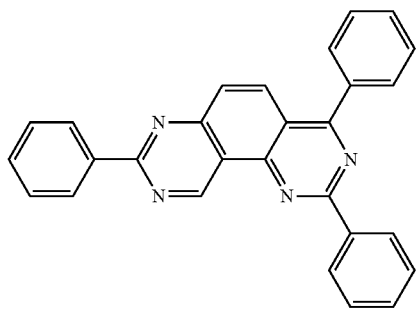

Structure 2

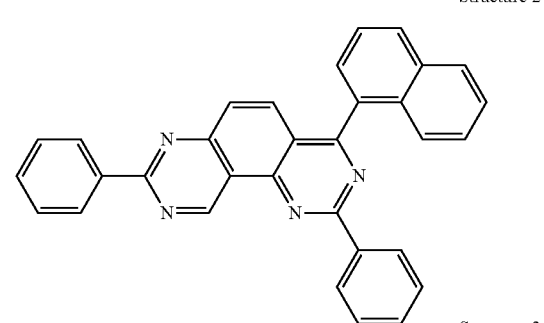

Structure 3

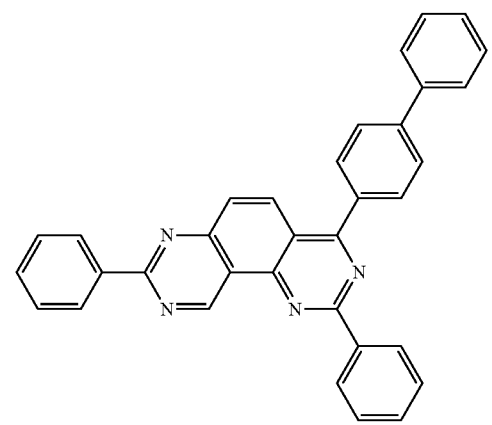

Structure 4
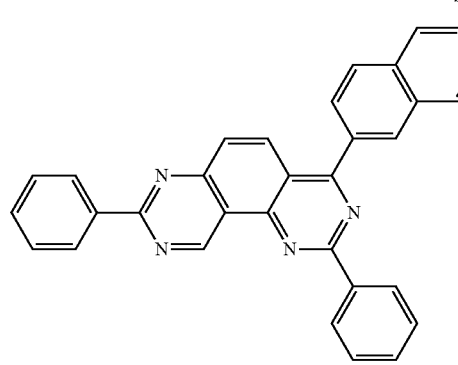
Structure 5
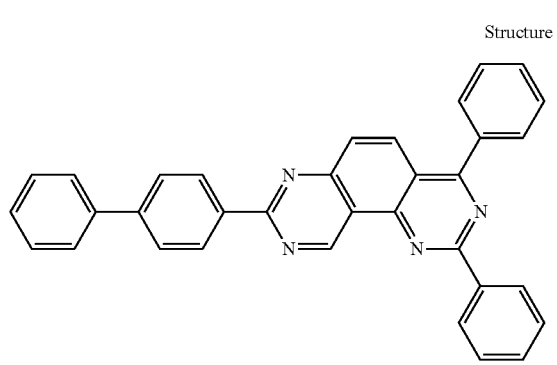
Structure 6
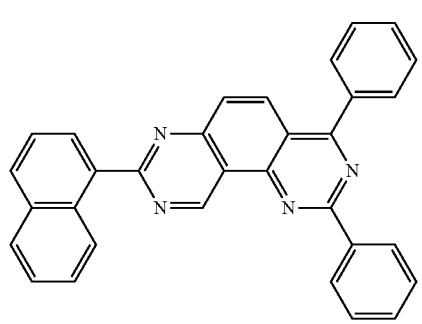
Structure 7
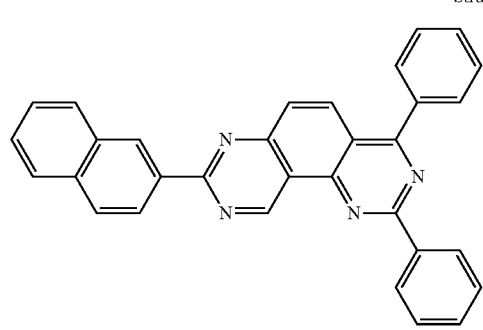
Structure 8
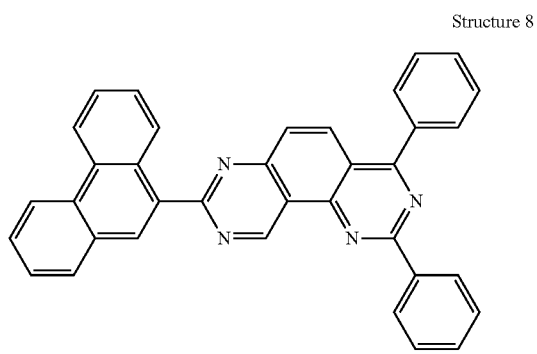
Structure 9
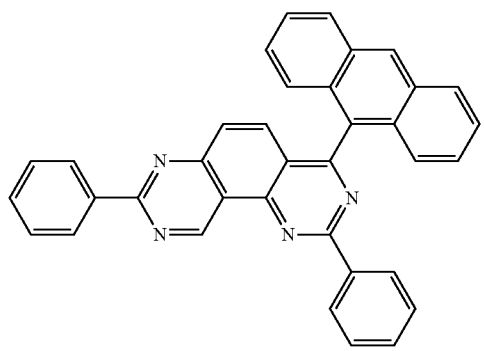
Structure 10
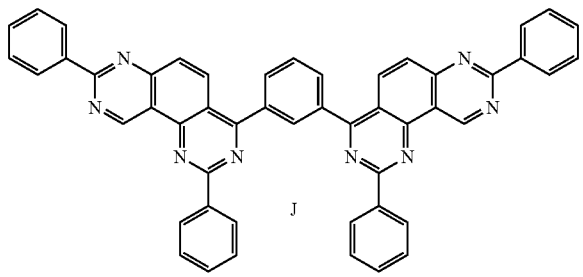
Structure 11
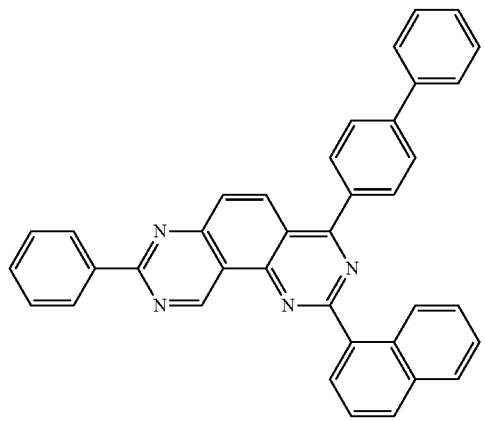

Structure 12
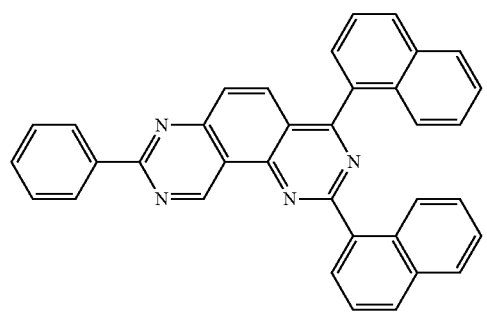
Structure 13
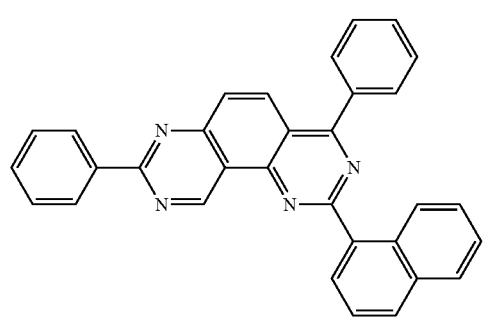
Structure 14
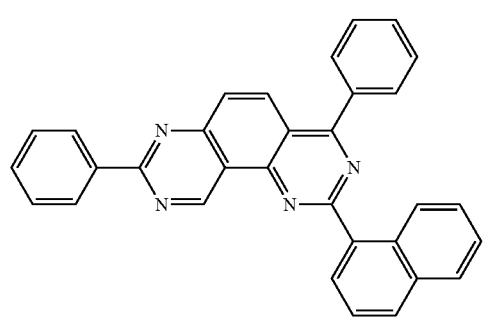
Structure 15
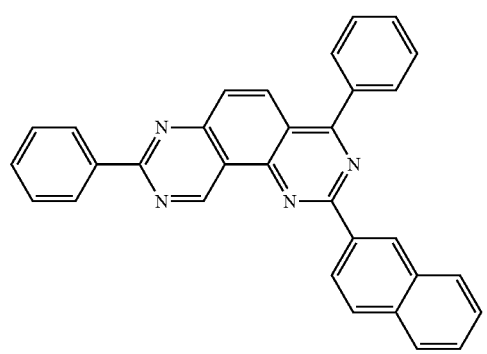
Structure 16
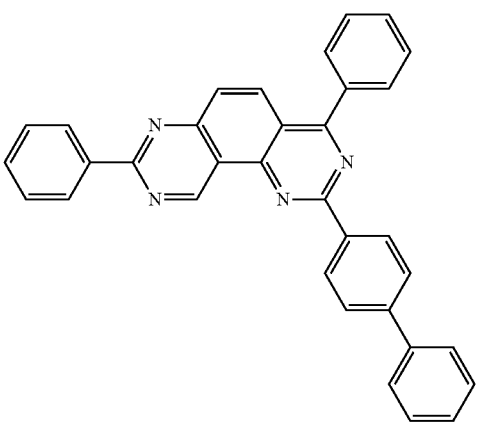
Structure 17
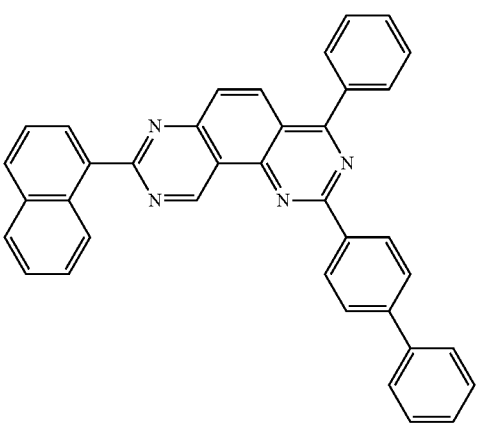
Structure 18
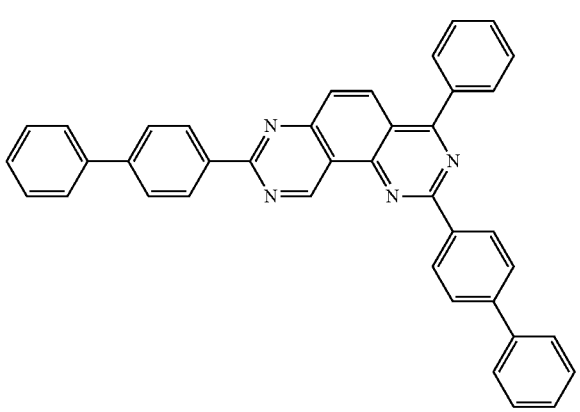

Structure 19
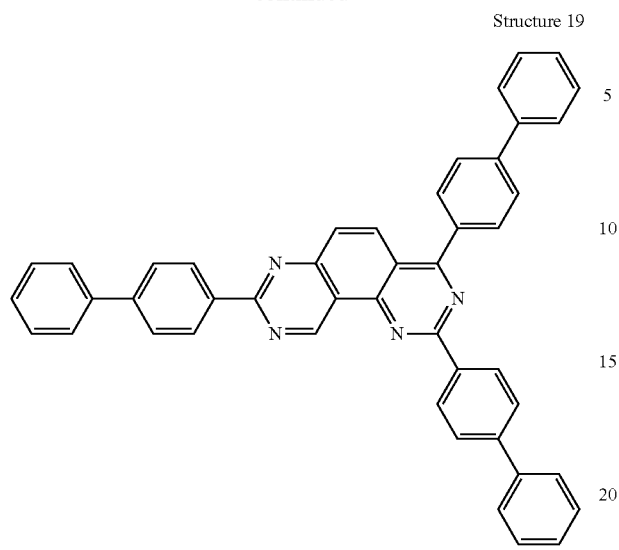

Structure 20
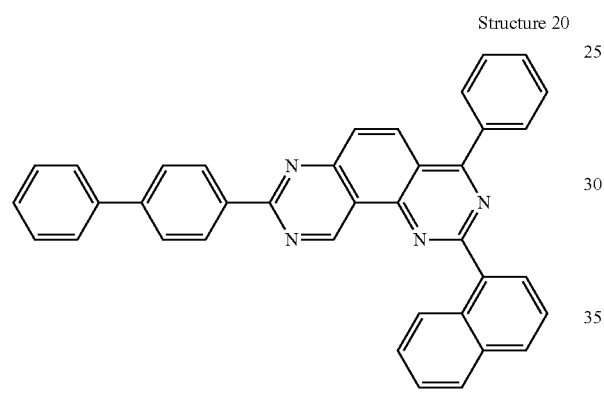

Structure 21
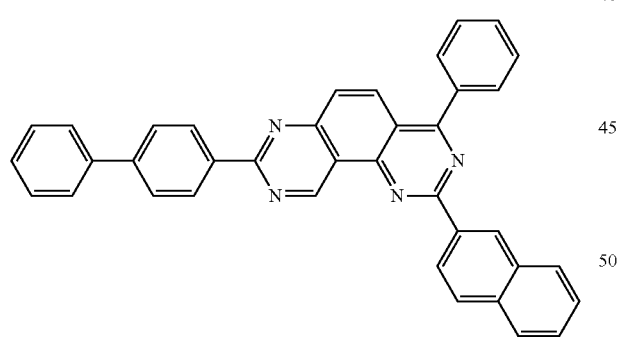

Structure 22
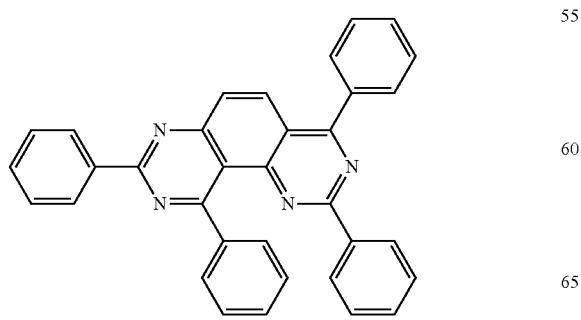

Structure 23
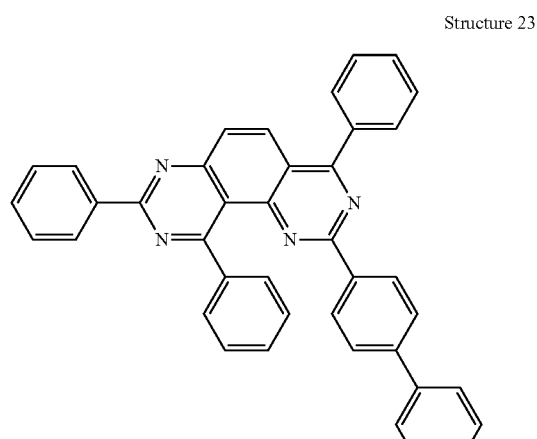

Structure 24
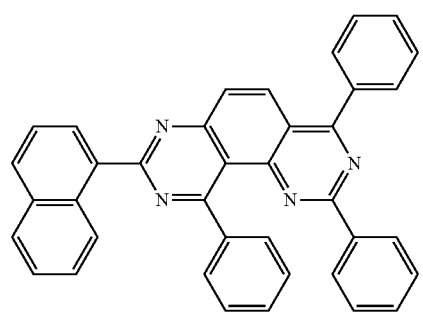

Structure 25
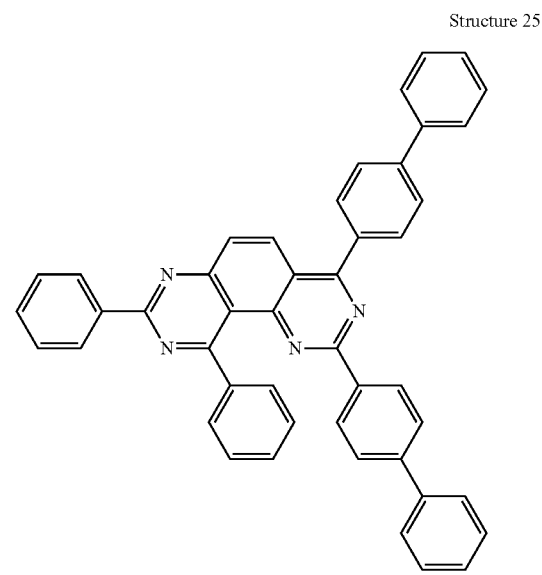

According to the invention is also a device comprising an organic semiconducting material comprising at least one organic matrix material which is optionally doped with at least one dopant, wherein the matrix material comprises a compound according to formulae (I)-(II).

In a light-emitting diode the compounds (I)-(II) can be used in electron transport layers, which might be optionally doped. The compounds can be also used in light-emitting diodes in interlayers such as hole blocking layers. Further, for organic solar cells, the compounds can be used to provide stable electron transport layers (ETL), wherein the ETLs can be further doped. Additionally, the invention provides stable materials for buffer layers for solar cells that can be doped or undoped.

According to the invention, especially a window semiconducting organic material is provided for the device that can be electrically doped achieving a high conductivity while it remains highly transparent in the visible spectra and has a high thermal stability.

According to the invention, also an organic field-effect transistor can be provided comprising at least one compound according to formulae (I)-(II) for use in a transport layer, in other words, in the semiconducting channel layer. An organic field effect transistor may also comprise at least one compound as disclosed as electronically inert buffer layer, when no charge is injected due to high potential barrier. An organic field effect transistor may also comprise at least one compound as disclosed as doped injection layer.

Provided can be also a doped pn-transition in an organic electronic element, for combining stacked organic light-emitting diodes, stacked solar cells and converting contacts to an electrode, respectively, as is, for example, known from EP 1 804 308 or EP 1 808 910.

pn-junctions in OLEDs are also called charge generation layer or connection unit. pn-junctions in organic solar cells are also called recombination layer.

Typically, the organic layer arrangement of an OLED or a solar cell comprises several organic layers which are stacked. Within one organic layer arrangement there may be also provided one or more charge generation layers, such as is known for stacked OLEDs (see EP 1 478 025 A2), wherein such a pn-transition is formed in one embodiment by means of a p-doped hole transport layer and an n-doped electron transport layer which are in direct contact with one another. Such a pn-transition provides a structure generating electric charges, in which, when applying an electrical potential, electrical charges are generated, preferably in the interface area between both layers.

In solar cells and photo sensors the pn-transition is also utilized to combine stacked hetero junctions and to, thus, add voltage generated by this element (US 2006 027 834 A). The charge generation layers have the same function as tunnel-junction in stacked inorganic heterojunction solar cells, although the physical mechanisms may be different.

The charge generation layers are also used to achieve an improved injection (extraction for solar cells) to the electrodes (EP 1 808 910).

For improving the energetic properties in an organic electronic element it was suggested in WO 2005/109 542 A1 to form a pn-transition with one layer of an organic semiconducting material of n-type and one layer of an organic material of p-type, wherein the layer of the organic semiconducting material of n-type is in contact with an electrode formed as an anode. By this, an improved injection of charge carriers in the form of holes into the layer of the organic semiconducting material of p-type is achieved.

The compounds used in this invention according to formulae (I)-(II) can be used in OLEDs in electron transport layers as a neat layer, or as a doped layer in combination with a redox dopant. The compounds can also be used in mixture with other electron transport materials, with other hole transport materials or with other functional materials such as emitter dopants.

The compounds can be used as hole blocking layers. Advantageous effects are seen over the prior art since the materials have a higher glass transition temperature compared to materials described in the prior art, such as in DE 10 2007 012 794 or EP 07 400 033.2 (not published yet).

The use of the compounds according to formula (I)-(II) provides high thermal stability, especially due to high glass transition temperature, a good LUMO position for organic light-emitting devices, good dupability, conductivity and charge carrier mobility, high transparency, easy synthesis. Further, preparation of these compounds can be conducted in a very cost-effective manner.

It was surprisingly round that especially the thermal stability of doped layers comprising a compound as disclosed can be significantly increased in the devices according to the present invention comprising matrix material. Especially, a glass transition temperature of over 100° C. was achieved with the compound shown in the examples. The combination of such a high glass temperature, the wide gap and the dopability make those compounds to have a high industrial relevance for use in organic electronic devices.

Additional features and advantages of the invention can be taken from the following detailed description of preferred embodiments, together with the drawings as attached.

The organic electronic device of the present invention may be an organic light emitting diode. FIG. 1 shows a typical layer structure of an organic light emitting diode. The layers are disposed on a substrate (10) in the following order: anode (11), p-doped hole transport layer (12), electron blocking layer (13), emission layer (14), hole blocking layer (15), n-electron transport layer (16), and cathode (17). Two or more layers can collapse into a smaller number of layers if properties can be combined. Inverted structure and multiple stacked OLEDs are also well known in the field. The emission layer is usually composed by an emitter matrix material and an emitter dopant; this layer can be also composed by several other layers to generate light with a broad spectrum combining several emitters, for example, to generate white light.

Figure 2:
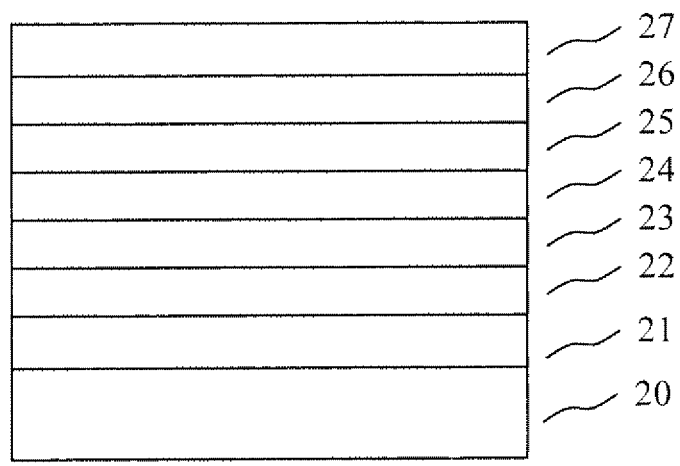
FIG. 2 shows a cross section of a typical small molecule organic solar cell.

FIG. 2 shows a typical small molecule organic solar cell. Many variations are possible. One simple structure that offers reasonable efficiencies is composed by a substrate (20), followed by: anode (21), p-doped hole transport layer (22), thin interlayer that is non-doped (23), the photo-active bulk-heterojunction (24), and electron transport layer (25), a buffer layer (26), and the cathode (27).

EXAMPLES

General Synthesis Method

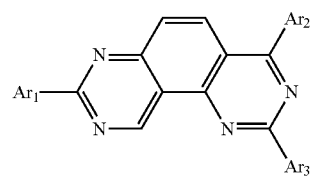

Structure (I) can be synthesized according to the synthetic route below:

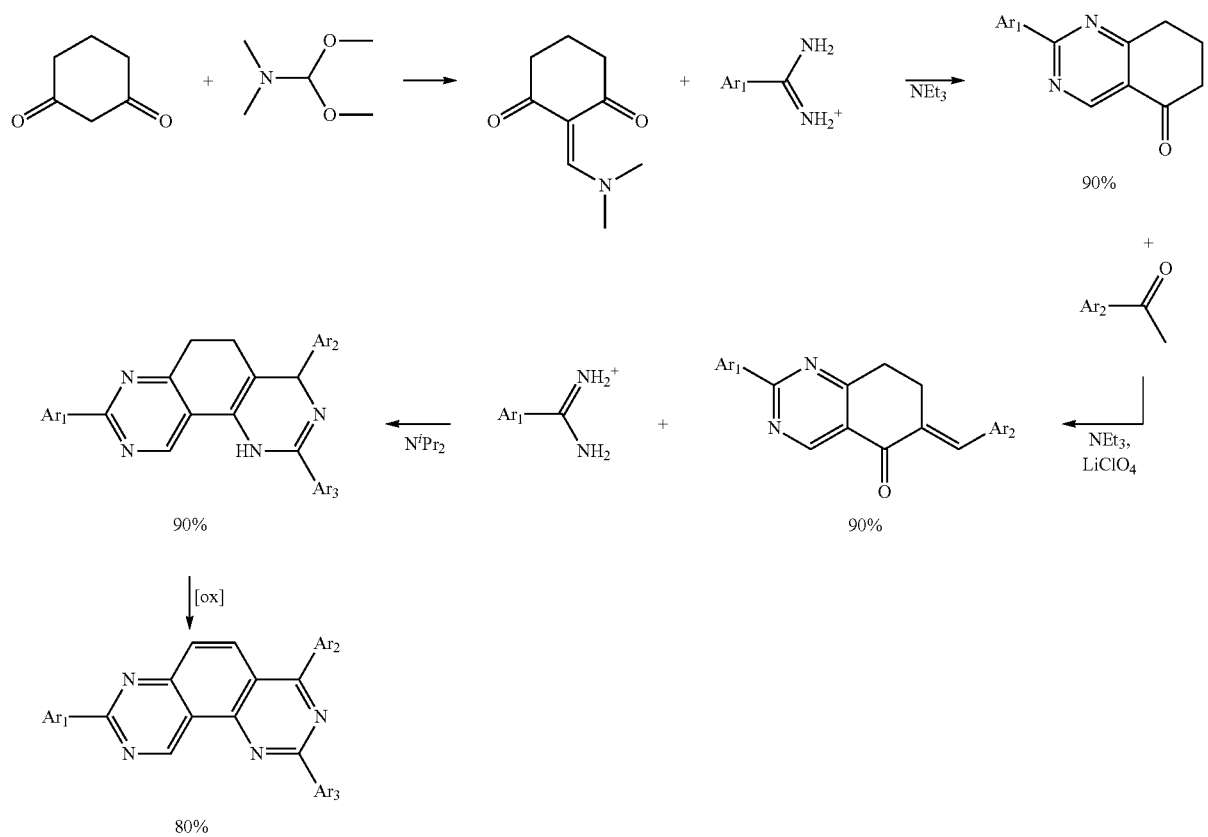
Structure (II) can be synthesized according to the synthetic route below:
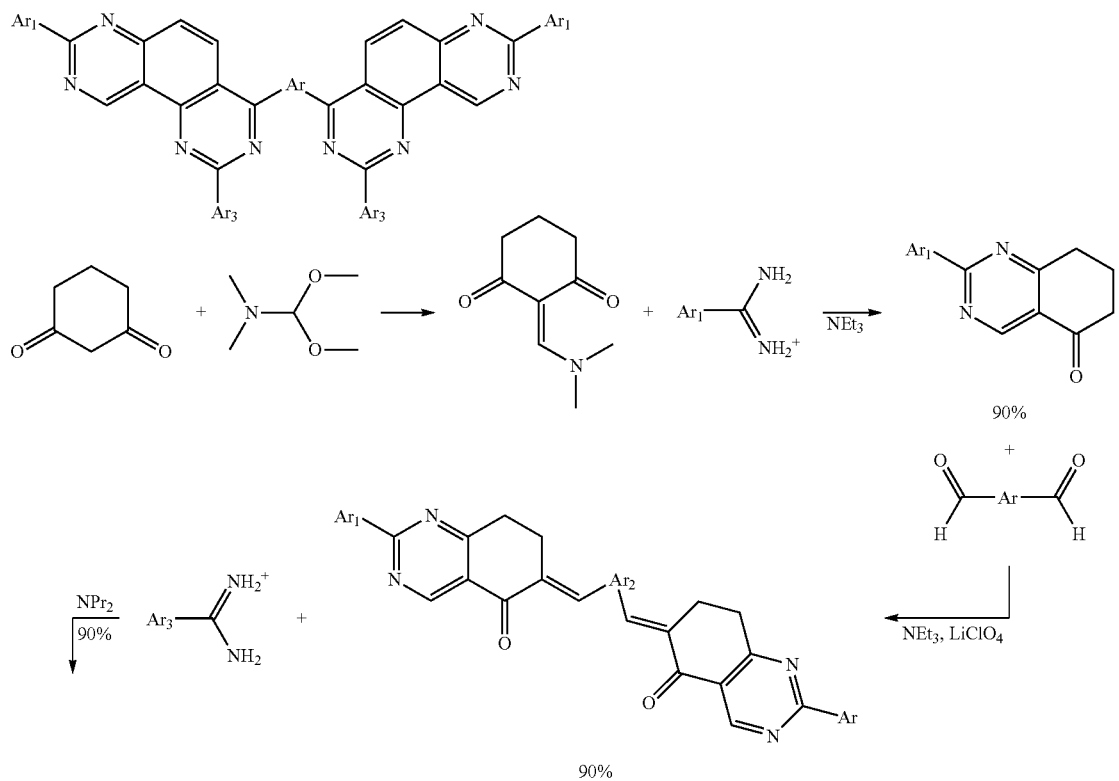

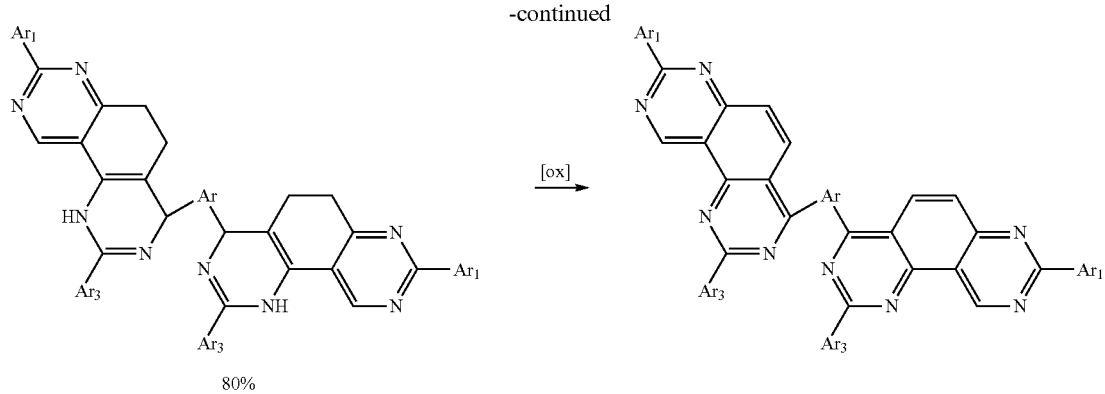

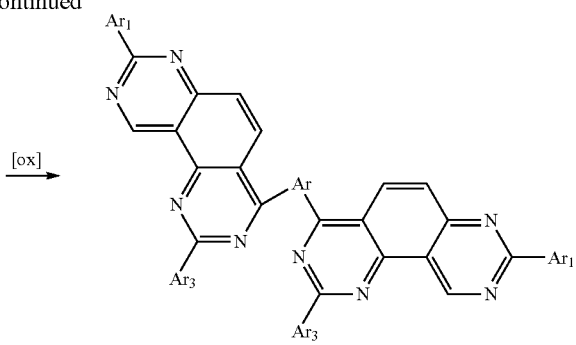

Example 1

Synthesis of

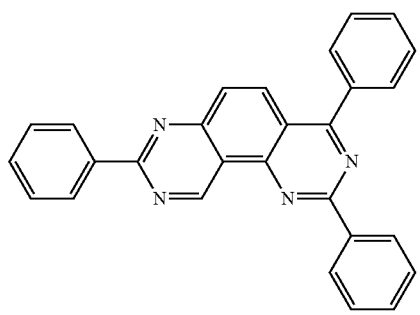 [SMILES: c1ccc(-c2ncc3c(ccc4c(-c5ccccc5)nc(-c5ccccc5)nc43)n2)cc1]

First step: Synthesis of 2-phenyl-7,8-dihydroquinazolin-5(6H)-one (1). All manipulations were carried out in air, without any further purification of commercial solvents/chemicals.

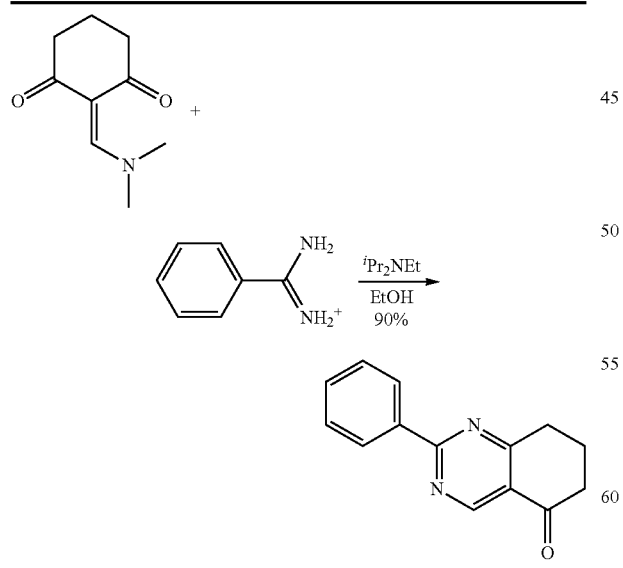

| 2-((dimethylamino)methylene)cyclo-hexane-1,3-dione | 16.7 g (100 mmol) |
|---|---|
| Benzamidinium Hydrochloride | 19.2 g (110 mmol) |
| N-ethyl-N-isopropylpropan-2-amine | 20 mL (120 mmol) |
| Ethanol | 100 mL |

A suspension of 2-((dimethylamino)methylene)cyclohexane-1,3-dione (16.7 g) and benzamidinium hydrochloride (19.2 g) in 75 mL Ethanol is refluxed in a 250 mL 2 neck-flask equipped with a reflux condenser and a dropwise addition funnel. The suspension turns into a solution upon boiling, after what a solution of N-Ethyl-N-isopropylpropane-2-amine in 25 mL Ethanol is added dropwise within 20 min. The solution turns from yellow to orange and is heated at reflux for 3 hours. The reaction mixture is cooled down to room temperature during which time a thick yellow precipitate appears.

Work Up

The suspension is poured in 100 mL distilled water and the suspension put in an ice bath and thoroughly stirred. 8 mL acetic acid is then slowly poured in and the suspension is stirred for an additional 30 min. The precipitate is then filtered using a Büchner and washed with salt-free water (200 mL). A beige powder is obtained after overnight drying (drying oven, 40° C.).

Yield: 21.9 g (96%),

Melting point: 124.5° C.

1H-NMR 1H NMR (500 MHz, CDCl3) δ 9.24 (s, 1H), 8.50 (dt, J=2.2, 3.7, 2H), 7.58-7.41 (m, 3H), 3.13 (t, 6.2, 2H), 2.78-2.62 (m, 2H), 2.30-2.14 (m, 2H).

Second step: Synthesis of 6-benzylidene-2-phenyl-7,8-dihydroquinazolin-5(6H)-one (2). All manipulations were carried out in air, without any further purification of commercial solvents/chemicals.

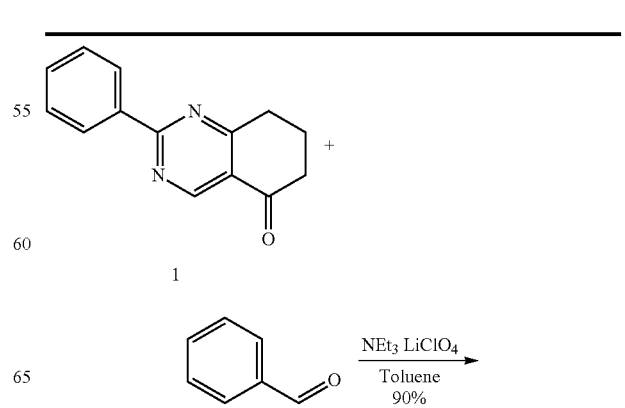

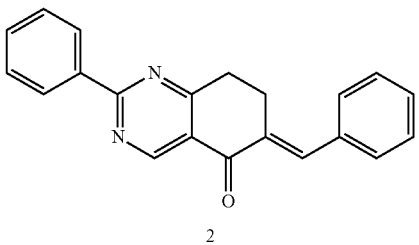 [SMILES: O=C1/C(=C/c2ccccc2)CCc2nc(-c3ccccc3)ncc21]

2

| 2-Phenyl-7,8-dihydroquinazolin-5(6H)-one | 5 g (22.5 mmol) |
|---|---|
| Benzaldehyde | 2.5 g (25 mmol) |
| Lithium perchlorate | 2.4 g (22.5 mmol) |
| Triethylamine | 0.3 mL (2 mmol) |
| Toluene | 60 mL |

2-phenyl-7,8-dihydroquinazolin-5(6H)-one (5 g), benzaldehyde (2.5 g) were put in flask in a 50 mL toluene volume. Triethylamine (0.3 mL) and lithium perchlorate (2.4 g) were then added and the solution was stirred at room temperature for 30 min, after which time a white precipitate appears. The suspension is stirred over night at room temperature and the volatiles were removed using a Rotavapor.

Work Up

The residue was then mixed with 80 mL Ethanol and heated to reflux for 10 min. After cooling, the yellow product was then filtered using a Büchner and washed with 20 mL ethanol. The yellow powder is then dried in a vacuum oven overnight (80° C.).

Yield; 6.3 g (90%)

Melting Point: 142° C.

1H NMR (500 MHz, CDCl3) δ 9.36 (s, 1H), 8.63-8.41 (m, 2H), 7.91 (s, 1H), 7.62-7.29 (m, 8H), 3.24 (dd, J=4.1, 9.6, 2H), 3.15 (t, J=6.6, 2H).

Third step: Synthesis of 2,4,8-triphenyl-1,4,5,6-tetrahydropyrimido[4,5-f]quinazoline (3). All manipulations were carried out in air, without any further purification of commercial solvents/chemicals.

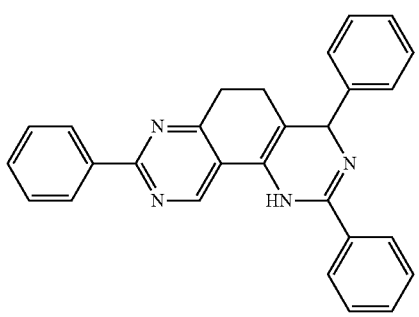

3

| 6-Benzylidene-2-phenyl-7,8-dihydro-quinazolin-5(6H)-one | 6.25 g (20 mmol) |
|---|---|
| Benzamidine Hydrochloride | 3.8 g (22 mmol) |
| N-ethyl-N-isopropylpropan-2-amine | 5 mL (29 mmol) |
| Ethanol | 50 mL |
| Ethyl acetate | 50 mL |

6-benzylidene-2-phenyl-7,8-dihydroquinazolin-5(6H)-one (6.25 g) and benzamidine hydrochloride (3.8 g) were allowed to stir in a mixture of ethanol (30 mL) and ethyl acetate (50 mL). A solution of N-ethyl-N-isopropylpropan-2-amine (5 mL) in 20 mL ethanol is then added within 10 min via an addition. After the addition, the suspension was refluxed for 30 h. After 30 minutes the suspension turned into a solution. After 30 hours, the solution is cooled down, and a yellow precipitate appears.

Work Up 11 ml of acetic acid is then slowly added to the suspension and stirred for 30 minutes at room temperature. The precipitate is filtered using a Büchner and washed with 20 mL ethanol and dried overnight in a vacuum oven.

Yield: 6.05 g (73%).

Melting Point: 200° C.

1H NMR (500 MHz, CDCl3) δ 9.31 (s, 1H), 8.43 (d, J=7.3, 2H), 7.85 (d, J=7.5, 2H), 7.57-7.27 (m, 12H), 5.72 (s, 1H), 5.31 (s, 1H), 3.15-2.84 (m, 2H), 2.49-2.12 (m, 2H).

Fourth step: Synthesis of 2,4,8-triphenylpyrimido[4,5-f]quinazoline (4). All manipulations were carried out in air, without any further purification of commercial solvents/chemicals.

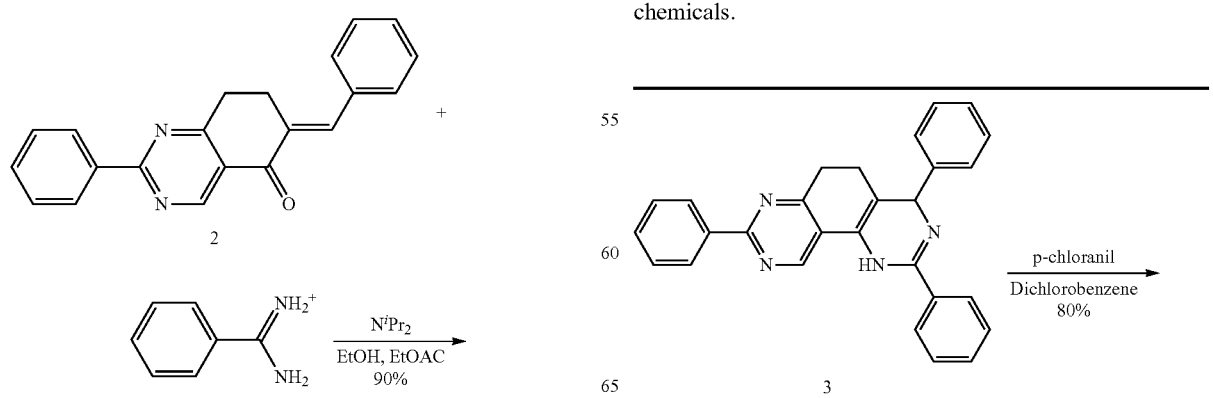

First step: Synthesis of 2-phenyl-7,8-dihydroquinazolin-5(6H)-one (1). All manipulations were carried out in air, without any further purification of commercial solvents/chemicals.

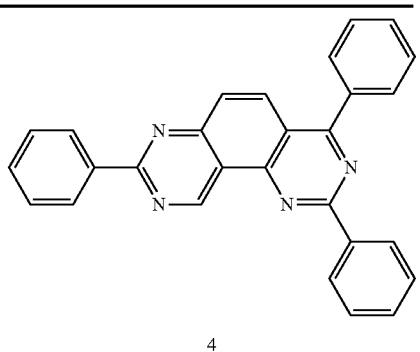

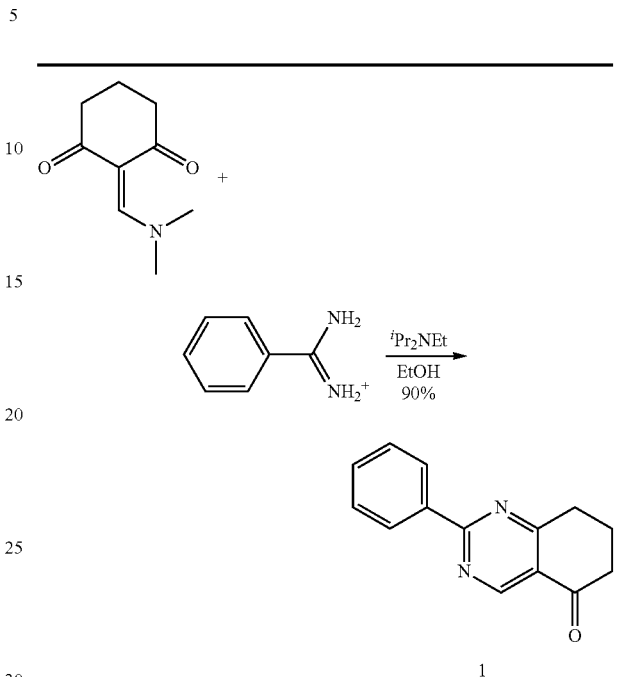

| | |
|---|---|
| 2-((Dimethylamino)methylene)cyclohexane-1,3-dione | 16.7 g (100 mmol) |
| Benzamidinium Hydrochloride | 19.2 g (110 mmol) |
| N-ethyl-N-isopropylpropan-2-amine | 20 mL (120 mmol) |
| Ethanol | 100 mL |

A suspension of 2-((dimethylamino)methylene)cyclohexane-1,3-dione (16.7 g) and benzamidinium hydrochloride (19.2 g) in 75 mL ethanol is refluxed in a 250 mL 2 neck-flask equipped with a reflux condenser and a dropwise addition funnel. The suspension turns into a solution upon boiling, after what a solution of N-ethyl-N-isopropylpropane-2-amine in 25 mL ethanol is added dropwise within 20 min. The solution turns from yellow to orange and is heated at reflux for 3 hours. The reaction mixture is cooled down to room temperature during which time a thick yellow precipitate appears.

Work Up

The suspension is poured in 100 mL distilled water and the suspension put in an ice bath and thoroughly stirred. 8 mL acetic acid is then slowly poured in and the suspension is stirred for an additional 30 min. The precipitate is then filtered using a Büchner and washed with salt-free water (200 mL). A beige powder is obtained after overnight drying (drying oven, 40° C.).

Yield: 21.9 g (96%),

Melting point: 124.5° C.

1H-NMR 1H NMR (500 MHz, CDCl3) δ 9.24 (s, 1H), 8.50 (dt, J=2.2, 3.7, 2H), 7.58-7.41 (m, 3H), 3.13 (t, J=6.2, 2H), 2.78-2.62 (m, 2H), 2.30-2.14 (m, 2H).

Second step: Synthesis of 6-benzylidene-2-phenyl-7,8-dihydroquinazolin-5(6H)-one (2). All manipulations were carried out in air, without any further purification of commercial solvents/chemicals.

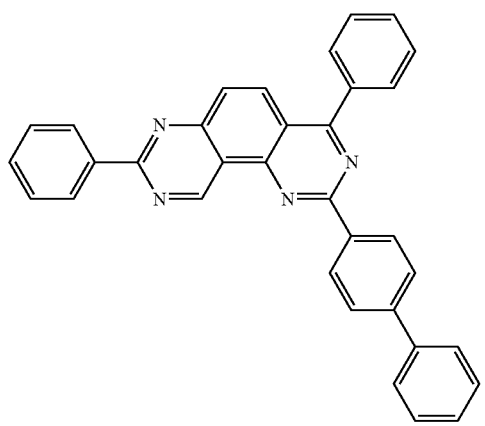 [SMILES: c1ccc(-c2ccc(-c3nc(-c4ccccc4)c4ccc5nc(-c6ccccc6)ncc5c4n3)cc2)cc1]

| | |
|---|---|
| 2,4,8-Triphenyl-1,4,5,6-tetrahydropyrimido[4,5-f]quinazoline | 6.2 g (15 mmol) |
| Chloranil | 5.6 g (23 mmol) |
| Dichlorobenzene | 50 mL |

2,4,8-triphenyl-1,4,5,6-tetrahydropyrimido[4,5-f]quinazoline (6.2 g) was suspended in 1,2-dichlorobenzene (50 mL) and warmed (60° C.) so that the material gets in solution. Then chloranil (4.1 g) was added portionwise. The solution turns from green to dark yellow. The solution was then refluxed. After 2 h, 0.5 g chloranil was added and after an additional 2 h another 1 g chloranil was finally added. After 9 h reflux, the solution was cooled down and a precipitate appears.

Work Up

The suspension was then added to 30 mL diethylether and stirred for 30 minutes at room temperature. The precipitate was then filtered using a Büchner and washed with 70 mL diethylether.

Yield: 4.9 g (80%)

HPLC purity is calculated using 250 nm as control wavelength. HPLC purity has to be minimum 99.5% otherwise washing step has to be restarted.

Melting Point: 241° C.

Tg: 78° C.

Cyclovoltammetry vs Fc: −2.02V (reversible in THF)

1H NMR (500 MHz, CDCl3) δ 10.85 (s, 1H), 8.83 (dd, J=2.0, 7.6, 2H), 8.75 (dd, J=3.2, 6.6, 2H), 8.45 (d, J=9.3, 1H), 8.04 (d, J=9.3, 1H), 7.91 (dd, J=3.1, 6.4, 2H), 7.69-7.62 (m, 3H), 7.62-7.53 (m, 6H).

Example 2

Synthesis of

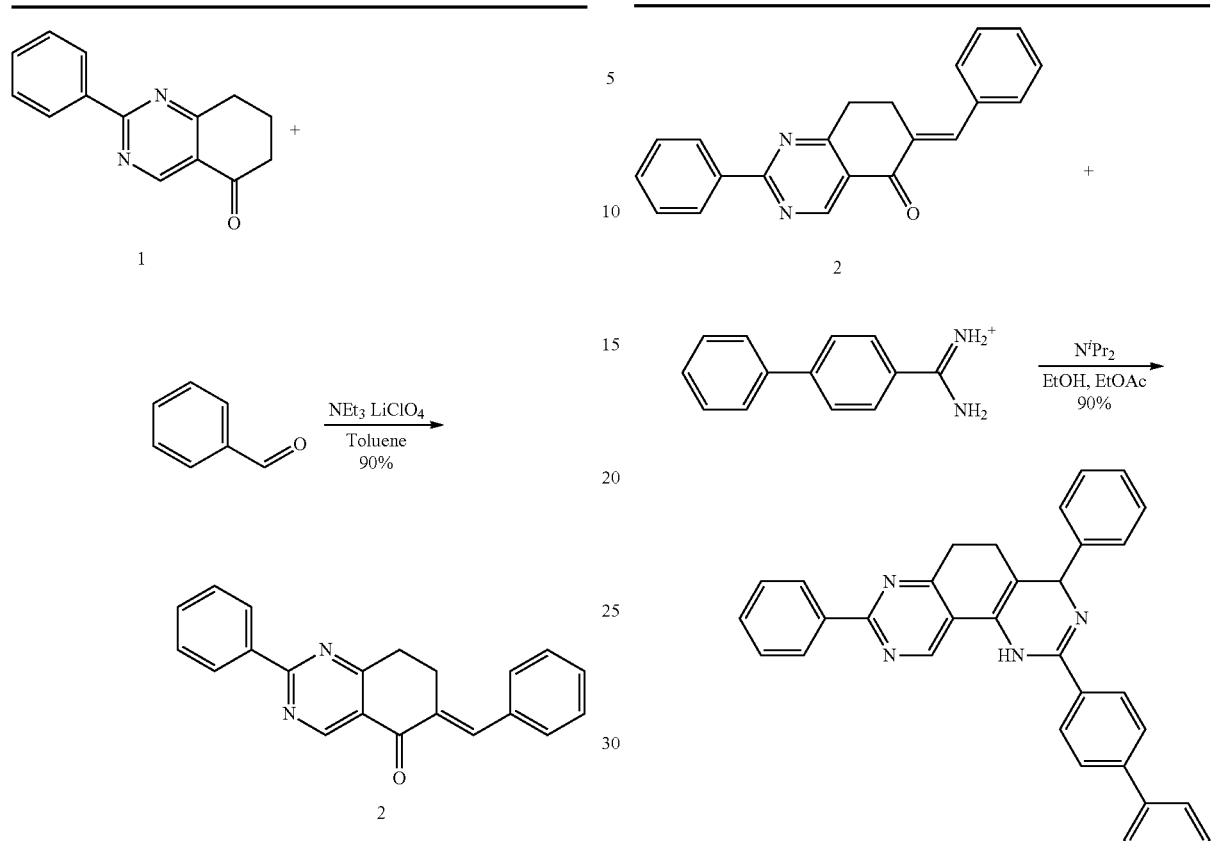

| 2-Phenyl-7,8-dihydroquinazolin-5(6H)-one | 5 g (22.5 mmol) |
|---|---|
| Benzaldehyde | 2.5 g (25 mmol) |
| Lithium perchlorate | 2.4 g (22.5 mmol) |
| Triethylamine | 0.3 mL (2 mmol) |
| Toluene | 60 mL |

2-phenyl-7,8-dihydroquinazolin-5(6H)-one (5 g), benzaldehyde (2.5 g) were put in flask in a 50 mL toluene volume. Triethylamine (0.3 mL) and lithium perchlorate (2.4 g) were then added and the solution was stirred at room temperature for 30 min, after which time a white precipitate appears. The suspension is stirred over night at room temperature and the volatiles were removed using a Rotavapor.

Work Up

The residue was then mixed with 80 mL Ethanol and heated to reflux for 10 min. After cooling, the yellow product was then filtered using a Büchner and washed with 20 mL ethanol. The yellow powder is then dried in a vacuum oven overnight (80° C.).

Yield: 6.3 g (90%)

Melting Point: 142° C.

1H NMR (500 MHz, CDCl3) δ 9.36 (s, 1H), 8.63-8.41 (m, 2H), 7.91 (s, 1H), 7.62-7.29 (m, 8H), 3.24 (dd, J=4.1, 9.6, 2H), 3.15 (t, J=6.6, 2H).

Third step: Synthesis of 2-([1,1'-biphenyl]-4-yl)-4,8-diphenyl-1,4,5,6-tetrahydropyrimido[4,5-f]quinazoline (5). All manipulations were carried out in air, without any further purification of commercial solvents/chemicals.

| 6-Benzylidene-2-phenyl-7,8-dihydroquinazolin-5(6H)-one | 6.25 g (20 mmol) |
|---|---|
| Benzamidine Hydrochloride | 3.8 g (22 mmol) |
| N-ethyl-N-isopropylpropan-2-amine | 5 mL (29 mmol) |
| Ethanol | 50 mL |
| Ethyl acetate | 50 mL |

6-benzylidene-2-phenyl-7,8-dihydroquinazolin-5(6H)-one (6.25 g) and benzamidine hydrochloride (3.8 g) were allowed to stir in a mixture of ethanol (30 mL) and ethyl acetate (50 mL). A solution of N-ethyl-N-isopropylpropan-2-amine (5 mL) in 20 mL ethanol is then added within 10 min via an addition. After the addition, the suspension was refluxed for 30 h. After 30 minutes the suspension turned into a solution. After 30 hours, the solution is cooled down, and a yellow precipitate appears.

Work Up 11 ml of acetic acid is then slowly added to the suspension and stirred for 30 minutes at room temperature. The precipitate is filtered using a Büchner and washed with 20 mL ethanol and dried overnight in a vacuum oven.

Yield: 6.05 g (73%).

Fourth step: Synthesis of 2-([1,1'-biphenyl]-4-yl)-4,8-diphenylpyrimido[4,5-f]quinazoline (6). All manipulations were carried out in air, without any further purification of commercial solvents/chemicals.

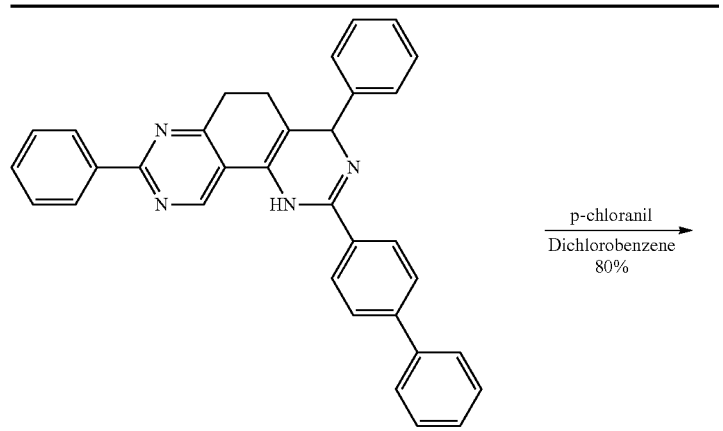

5

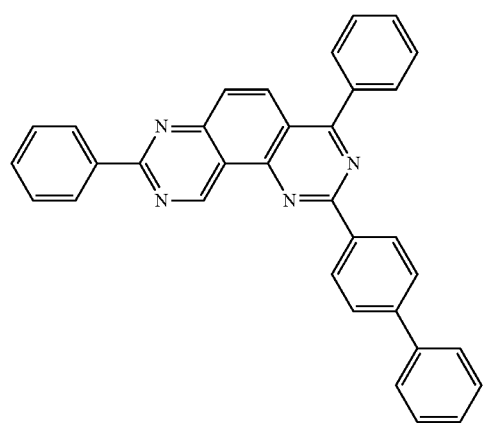

6

| 2,4,8-Triphenyl-1,4,5,6-tetrahydropyrimido[4,5-f]quinazoline | 6.2 g (15 mmol) |
| --- | --- |
| Chloranil | 5.6 g (23 mmol) |
| Dichlorobenzene | 50 mL |

2,4,8-triphenyl-1,4,5,6-tetrahydropyrimido[4,5-f]quinazoline (6.2 g) was suspended in 1,2-dichlorobenzene (50 mL) and warmed (60° C.) so that the material gets in solution. Then chloranil (4.1 g) was added portionwise. The solution turns from green to dark yellow. The solution was then refluxed. After 2 h, 0.5 g chloranil was added and after an additional 2 h another 1 g chloranil was finally added. After 9 h reflux, the solution was cooled down and a precipitate appears.

Work Up

The suspension was then added to 30 mL diethylether and stirred for 30 minutes at room temperature. The precipitate was then filtered using a Büchner and washed with 70 mL diethylether.

Yield: 4.9 g (80%)

HPLC purity is calculated using 250 nm as control wavelength. HPLC purity has to be minimum 99.5% otherwise washing step has to be restarted.

Melting Point: 263° C.

Tg: 102° C.

Cyclovoltammetry vs Fc: −2.00V (reversible in THF)

1H NMR (500 MHz, CDCl3) δ 10.83 (s, 1H), 8.88 (d, J=8.3, 2H), 8.72 (dd, J=1.9, 7.6, 2H), 8.40 (d, J=9.3, 1H), 7.97 (d, J=9.3, 1H), 7.92 (dd, 2.0, 7.3, 2H), 7.80 (d, J=8.3, 2H), 7.71 (d, J=7.3, 2H), 7.68-7.52 (m, 6H), 7.49 (t, J=7.6, 2H), 7.39 (t, J=7.3, 1H).

Example 3

Synthesis of

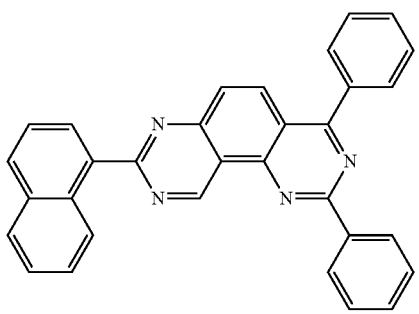 [SMILES: c1ccc(-c2nc(-c3ccccc3)c3ccc4nc(-c5cccc6ccccc56)ncc4c3n2)cc1]

First step: Synthesis of 2-(naphthalen-1-yl)-7,8-dihydroquinazolin-5(6H)-one (7). All manipulations were carried out in air, without any further purification of commercial solvents/chemicals.

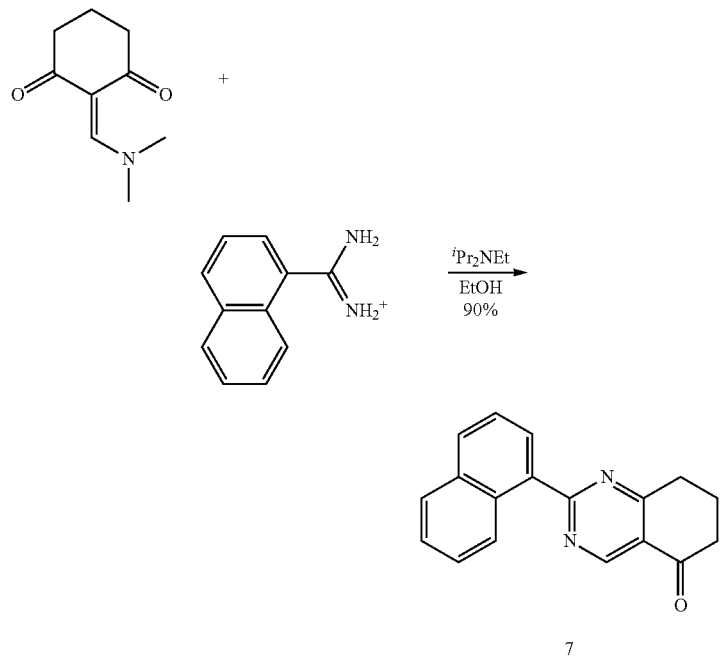

| | |
|---|---|
| 2-((Dimethylamino)methylene)cyclohexane-1,3-dione | 16.7 g (100 mmol) |
| Benzamidinium Hydrochloride | 19.2 g (110 mmol) |
| N-ethyl-N-isopropylpropan-2-amine | 20 mL (120 mmol) |
| Ethanol | 100 mL |

A suspension of 2-((dimethylamino)methylene)cyclohexane-1,3-dione (16.7 g) and benzamidinium hydrochloride (19.2 g) in 75 mL ethanol is refluxed in a 250 mL 2 neck-flask equipped with a reflux condenser and a dropwise addition funnel. The suspension turns into a solution upon boiling, after what a solution of N-ethyl-N-isopropylpropane-2-amine in 25 mL ethanol is added dropwise within 20 min. The solution turns from yellow to orange and is heated at reflux for 3 hours. The reaction mixture is cooled down to room temperature during which time a thick yellow precipitate appears.

Work Up

The suspension is poured in 100 mL distilled water and the suspension put in an ice bath and thoroughly stirred. 8 mL acetic acid is then slowly poured in and the suspension is stirred for an additional 30 min. The precipitate is then filtered using a Büchner and washed with salt-free water (200 mL). A beige powder is obtained after overnight drying (drying oven, 40° C.).

Yield: 21.9 g (96%),

1H-NMR 1H NMR (500 MHz, CDCl3) δ 9.24 (s, 1H), 8.50 (dt, J=2.2, 3.7, 2H), 7.58-7.41 (m, 3H), 3.13 (t, J=6.2, 2H), 2.78-2.62 (m, 2H), 2.30-2.14 (m, 2H).

Second step: Synthesis of 6-benzylidene-2-phenyl-7,8-dihydroquinazolin-5(6H)-one (8). All manipulations were carried out in air, without any further purification of commercial solvents/chemicals.

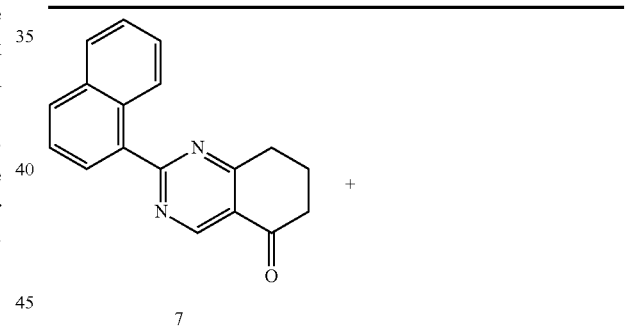

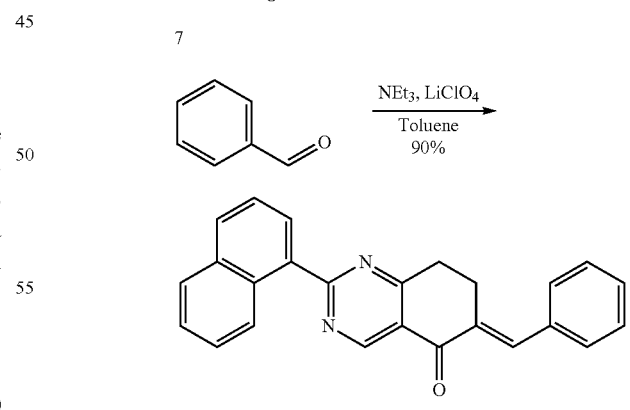

| | |
|---|---|
| 2-Phenyl-7,8-dihydroquinazolin-5(6H)-one | 5 g (22.5 mmol) |
| Benzaldehyde | 2.5 g (25 mmol) |
| Lithium perchlorate | 2.4 g (22.5 mmol) |
| Triethylamine | 0.3 mL (2 mmol) |
| Toluene | 60 mL |

2-phenyl-7,8-dihydroquinazolin-5(6H)-one (5 g), benzaldehyde (2.5 g) were put in flask in a 50 mL toluene volume. Triethylamine (0.3 mL) and lithium perchlorate (2.4 g) were then added and the solution was stirred at room temperature for 30 min, after which time a white precipitate appears. The suspension is stirred over night at room temperature and the volatiles were removed using a Rotavapor.

Work Up

The residue was then mixed with 80 mL Ethanol and heated to reflux for 10 min. After cooling, the yellow product was then filtered using a Büchner and washed with 20 mL ethanol. The yellow powder is then dried in a vacuum oven overnight (80° C.).

Yield: 6.3 g (90%)

Third step: Synthesis of 2-([1,1'-biphenyl]-4-yl)-4,8-diphenyl-1,4,5,6-tetrahydropyrimido[4,5-f]quinazoline (5). All manipulations were carried out in air, without any further purification of commercial solvents/chemicals.

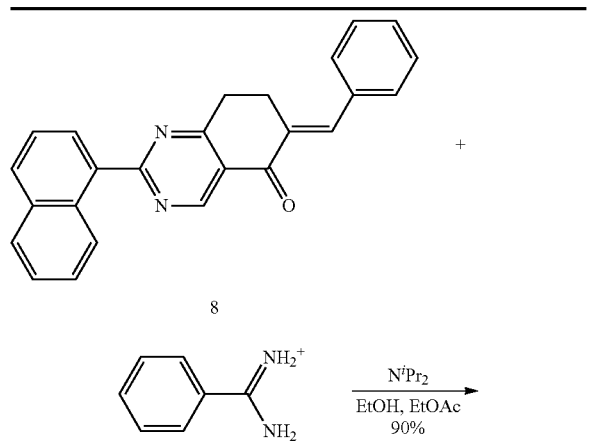

8

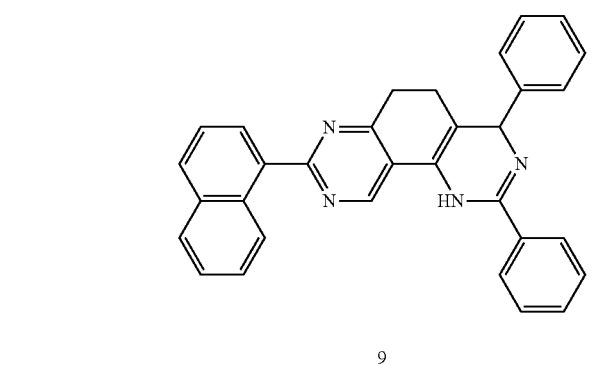 [SMILES: c1ccc(C2=NC(c3ccccc3)C3=C(N2)c2cnc(-c4cccc5ccccc45)nc2CC3)cc1]

9

| 6-Benzylidene-2-phenyl-7,8-dihydroquinazolin-5(6H)-one | 6.25 g (20 mmol) |
|---|---|
| Benzamidine Hydrochloride | 3.8 g (22 mmol) |
| N-ethyl-N-isopropylpropan-2-amine | 5 mL (29 mmol) |
| Ethanol | 50 mL |
| Ethyl acetate | 50 mL |

6-benzylidene-2-phenyl-7,8-dihydroquinazolin-5(6H)-one (6.25 g) and benzamidine hydrochloride (3.8 g) were allowed to stir in a mixture of ethanol (30 mL) and ethyl acetate (50 mL). A solution of N-ethyl-N-isopropylpropan-2-amine (5 mL) in 20 mL ethanol is then added within 10 min via an addition. After the addition, the suspension was refluxed for 30 h. After 30 minutes the suspension turned into a solution. After 30 hours, the solution is cooled down, and a yellow precipitate appears.

Work Up 11 ml of acetic acid is then slowly added to the suspension and stirred for 30 minutes at room temperature. The precipitate is filtered using a Büchner and washed with 20 mL ethanol and dried overnight in a vacuum oven.

Yield: 6.05 g (73%).

Fourth step: Synthesis of 2-([1,1'-biphenyl]-4-yl)-4,8-diphenylpyrimido[4,5-f]quinazoline (6). All manipulations were carried out in air, without any further purification of commercial solvents/chemicals.

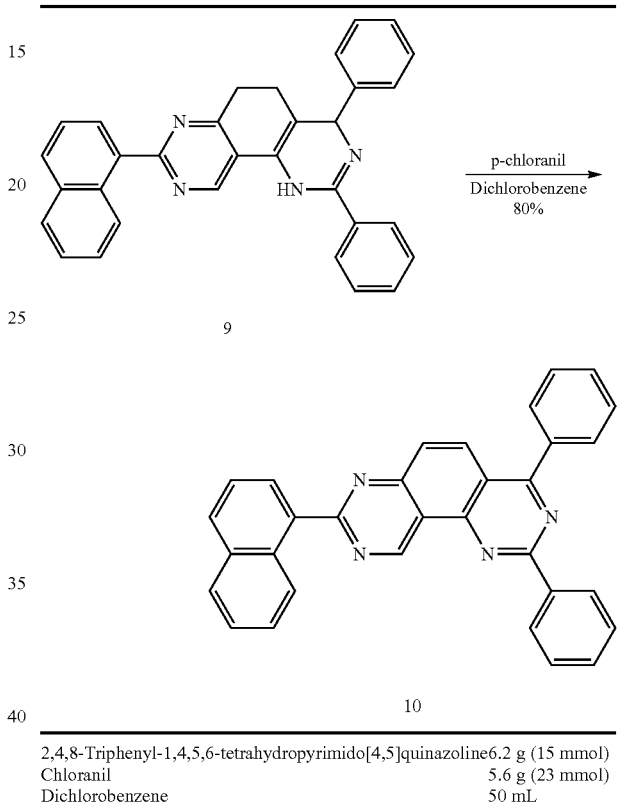

| 2,4,8-Triphenyl-1,4,5,6-tetrahydropyrimido[4,5]quinazoline | 6.2 g (15 mmol) |
|---|---|
| Chloranil | 5.6 g (23 mmol) |
| Dichlorobenzene | 50 mL |

2,4,8-triphenyl-1,4,5,6-tetrahydropyrimido[4,5-f]quinazoline (6.2 g) was suspended in 1,2-dichlorobenzene (50 mL) and warmed (60° C.) so that the material gets in solution. Then chloranil (4.1 g) was added portionwise. The solution turns from green to dark yellow. The solution was then refluxed. After 2 h, 0.5 g chloranil was added and after an additional 2 h another 1 g chloranil was finally added. After 9 h reflux, the solution was cooled down and a precipitate appears.

Work Up

The suspension was then added to 30 mL diethylether and stirred for 30 minutes at room temperature. The precipitate was then filtered using a Büchner and washed with 70 mL diethylether.

Yield: 4.9 g (80%)

HPLC purity is calculated using 250 nm as control wavelength. HPLC purity has to minimum 99.5% otherwise washing step has to be restarted.

Melting Point: 208° C.

Tg: 85° C.

Cyclovoltammetry vs Fc: −2.0 V (reversible in THF)

Example 4

Synthesis of

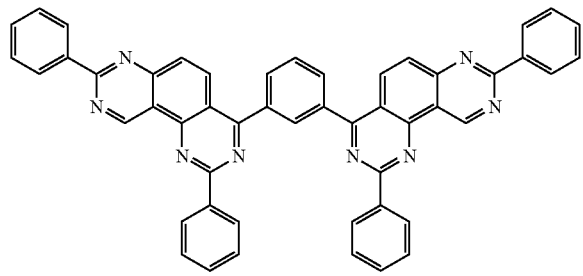 [SMILES: c1ccc(-c2ncc3c(ccc4c(-c5cccc(-c6nc(-c7ccccc7)nc7c6ccc6nc(-c8ccccc8)ncc67)c5)nc(-c5ccccc5)nc43)n2)cc1]

First step: Synthesis of 2-phenyl-7,8-dihydroquinazolin-5(6H)-one (1). All manipulations were carried out in air, without any further purification of commercial solvents/chemicals.

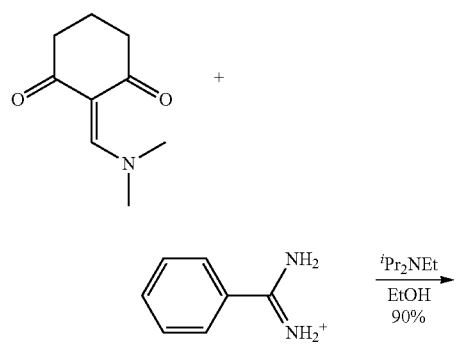

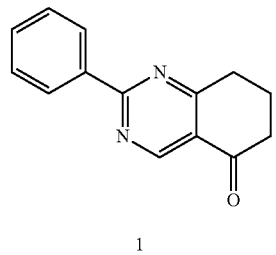 [SMILES: O=C1CCCc2nc(-c3ccccc3)ncc21]

1

| 2-((Dimethylamino)methylene)cyclohexane-1,3-dione | 16.7 g (100 mmol) |
| Benzamidinium Hydrochloride | 19.2 g (110 mmol) |
| N-ethyl-N-isopropylpropan-2-amine | 20 mL (120 mmol) |
| Ethanol | 100 mL |

A suspension of 2-((dimethylamino)methylene)cyclohexane-1,3-dione (16.7 g) and benzamidinium hydrochloride (19.2 g) in 75 mL Ethanol is refluxed in a 250 mL 2 neck-flask equipped with a reflux condenser and a dropwise addition funnel. The suspension turns into a solution upon boiling, after what a solution of N-Ethyl-N-isopropylpropane-2-amine in 25 mL ethanol is added dropwise within 20 min. The solution turns from yellow to orange and is heated at reflux for 3 hours. The reaction mixture is cooled down to room temperature during which time a thick yellow precipitate appears.

Work Up

The suspension is poured in 100 ml, distilled water and the suspension put in an ice bath and thoroughly stirred. 8 mL acetic acid is then slowly poured in and the suspension is stirred for an additional 30 min. The precipitate is then filtered using a Büchner and washed with salt-free water (200 mL). A beige powder is obtained after overnight drying (drying oven, 40° C.).

Yield: 21.9 g (96%),
Melting point: 124.5° C.
1H-NMR 1H NMR (500 MHz, CDCl3) δ 9.24 (s, 1H), 8.50 (dt, J=12, 3.7, 2H), 7.58-7.41 (m, 3H), 3.13 (t, J=6.2, 2H), 2.78-2.62 (m, 2H), 2.30-2.14 (m, 2H).

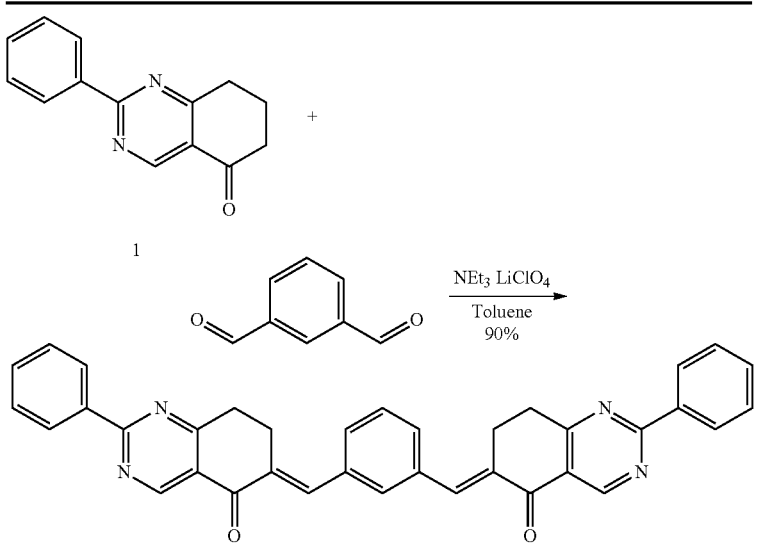

| 2-Phenyl-7,8-dihydroquinazoline-5(6H)-one | 5 g (22.5 mmol) |
| Benzaldehyde | 2.5 g (25 mmol) |

| | |
|---|---|
| Lithium perchlorate | 2.4 g (22.5 mmol) |
| Triethylamine | 0.3 mL (2 mmol) |
| Toluene | 60 mL |

2-phenyl-7,8-dihydroquinazolin-5(6H)-one (5 g), benzaldehyde (2.5 g) were put in flask in a 50 mL toluene volume. Triethylamine (0.3 mL) and lithium perchlorate (2.4 g) were then added and the solution was stirred at room temperature for 30 min, after which time a white precipitate appears. The suspension is stirred over night at room temperature and the volatiles were removed using a Rotavapor.

Work Up

The residue was then mixed with 80 mL ethanol and heated to reflux for 10 min. After cooling, the yellow product was then filtered using a Büchner and washed with 20 mL ethanol. The yellow powder is then dried in a vacuum oven overnight (80° C.).

Yield: 6.3 g (90%)

Melting Point: 142° C.

Third step: Synthesis of 4-(3-(2,8-diphenyl-1,2,5,6-tetrahydropyrimido[4,5-f]quinazolin-4-yl)phenyl)-2,8-diphenyl-1,4,5,6-tetrahydropyrimido[4,5-f]quinazoline (12). All manipulations were carried out in air, without any further purification of commercial solvents/chemicals.

6-benzylidene-2-phenyl-7,8-dihydroquinazolin-5(6H)-one (6.25 g) and Benzamidine Hydrochloride (3.8 g) were allowed to stir in a mixture of ethanol (30 mL) and ethyl acetate (50 mL). A solution of N-ethyl-N-isopropylpropan-2-amine (5 mL) in 20 mL ethanol is then added within 10 min via an addition. After the addition, the suspension was refluxed for 30 h. After 30 minutes the suspension turned into a solution. After 30 hours, the solution is cooled down, and a yellow precipitate appears.

Work Up 11 ml of acetic acid is then slowly added to the suspension and stirred for 30 minutes at room temperature. The precipitate is filtered using a Büchner and washed with 20 mL ethanol and dried overnight in a vacuum oven.

Yield: 6.05 g (73%).

Melting Point: 200° C.

Fourth step: Synthesis of 1,3-bis(2,8-diphenylpyrimido[4,5-f]quinazolin-4-yl)benzene (13). All manipulations were carried out in air, without any further purification of commercial solvents/chemicals.

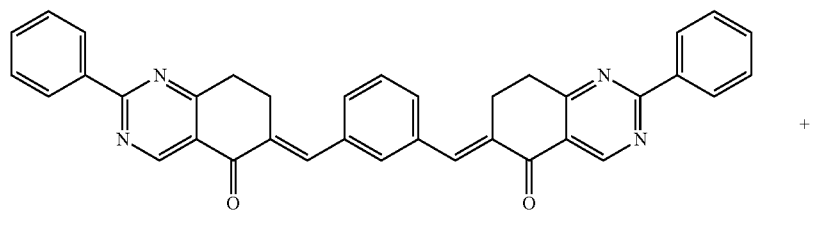

11

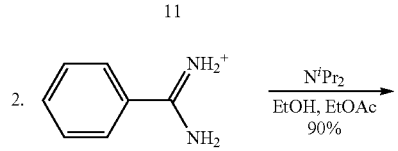

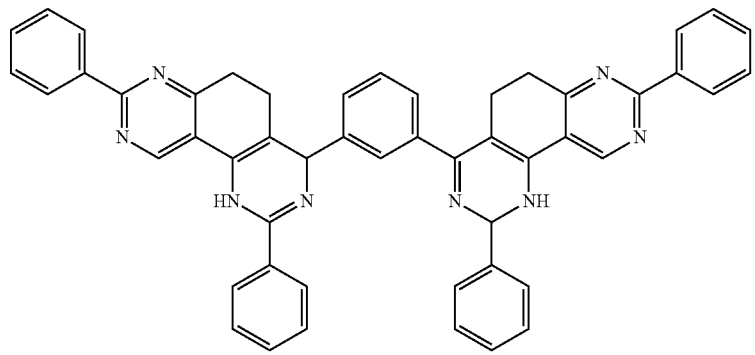

12

| | |
|---|---|
| 6-Benzylidene-2-phenyl-7,8-dihydroquinazolin-5(6H)-one | 6.25 g (20 mmol) |
| Benzamidine Hydrochloride | 3.8 g (22 mmol) |
| N-ethyl-N-isopropylpropan-2-amine | 5 mL (29 mmol) |
| Ethanol | 50 mL |
| Ethyl acetate | 50 mL |

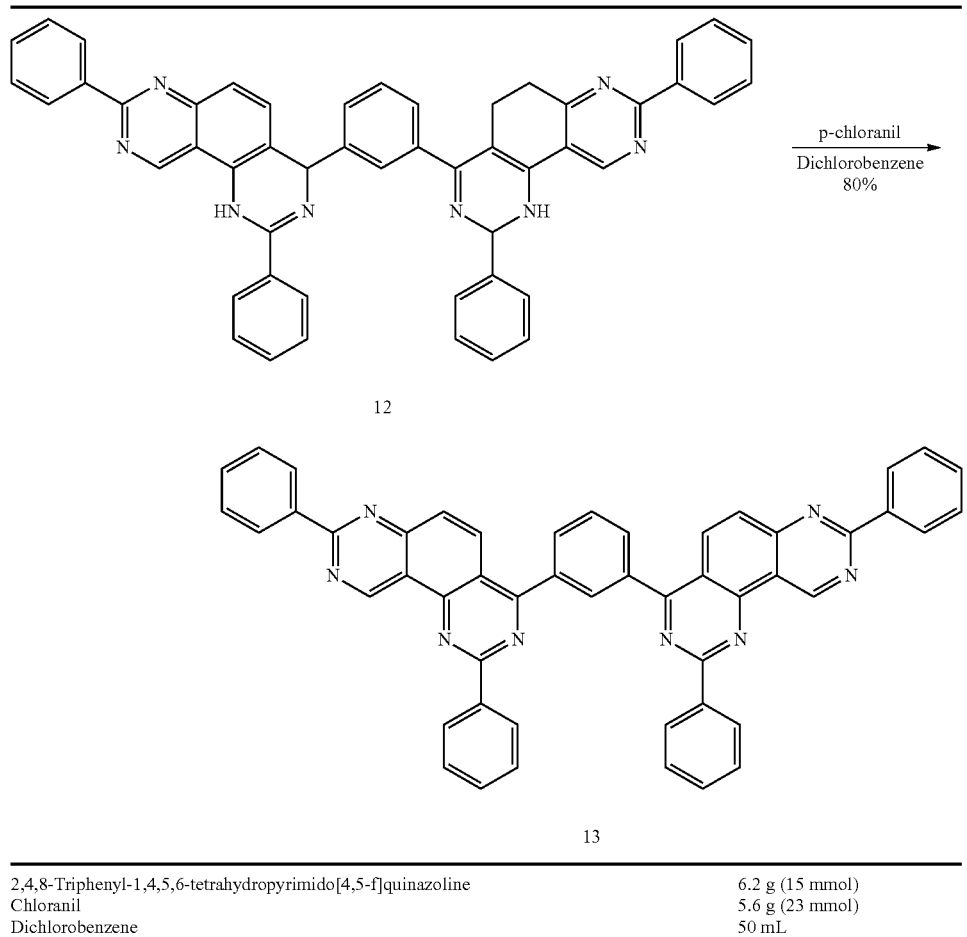

| | |
|---|---|
| 2,4,8-Triphenyl-1,4,5,6-tetrahydropyrimido[4,5-f]quinazoline | 6.2 g (15 mmol) |
| Chloranil | 5.6 g (23 mmol) |
| Dichlorobenzene | 50 mL |

2,4,8-triphenyl-1,4,5,6-tetrahydropyrimido[4,5-f]quinazoline (6.2 g) was suspended in 1,2-dichlorobenzene (50 mL) and warmed (60° C.) so that the material gets in solution. Then chloranil (4.1 g) was added portionwise. The solution turns from green to dark yellow. The solution was then refluxed. After 2 h, 0.5 g chloranil was added and after an additional 2 h another 1 g chloranil was finally added. After 9 h reflux, the solution was cooled down and a precipitate appears.

Work Up

The suspension was then added to 30 mL diethylether and stirred for 30 minutes at room temperature. The precipitate was then filtered using a Büchner and washed with 70 mL diethylether.

Yield: 4.9 g (80%)

HPLC purity is calculated using 250 nm as control wavelength. HPLC purity has to be minimum 99.5% otherwise washing step has to be restarted.

Melting Point: 338° C.

Tg: 189° C.

Cyclovoltammetry vs Fc: −1.95V (reversible in THF)

1H NMR (500 MHz, CDCl3) δ 10.85 (s, 1H), 8.83 (dd, J=2.0, 7.6, 2H), 8.75 (dd, J=3.2, 6.6, 2H), 8.45 (d, J=9.3, 1H), 8.04 (d, J=9.3, 1H), 7.91 (dd, J=3.1, 6.4, 2H), 7.69-7.62 (m, 3H), 7.62-7.53 (m, 6H).

Example 5

Synthesis of

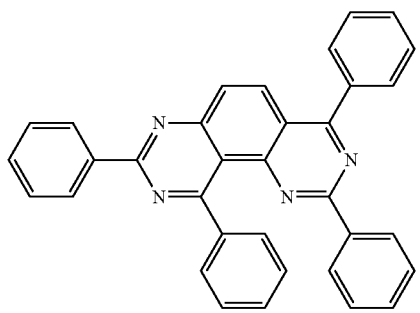 [SMILES: c1ccc(-c2nc(-c3ccccc3)c3c(ccc4c(-c5ccccc5)nc(-c5ccccc5)nc43)n2)cc1]

First step: Synthesis of 2-phenyl-7,8-dihydroquinazolin-5 (6H)-one (1). All manipulations were carried out in air, without any further purification of commercial solvents/chemicals.

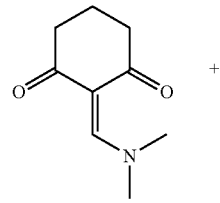
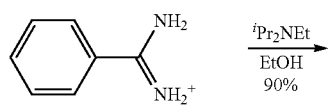
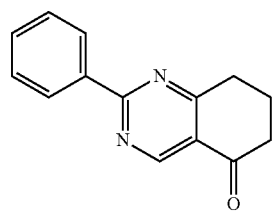

1

| 2-((Dimethylamino)methylene)cyclohexane-1,3-dione | 16.7 g (100 mmol) |
|---|---|
| Benzamidinium Hydrochloride | 19.2 g (110 mmol) |
| N-ethyl-N-isopropylpropan-2-amine | 20 mL (120 mmol) |
| Ethanol | 100 mL |

A suspension of 2-((dimethylamino)methylene)cyclohexane-1,3-dione (16.7 g) and benzamidinium hydrochloride (19.2 g) in 75 mL Ethanol is refluxed in a 250 mL 2 neck-flask equipped with a reflux condenser and a dropwise addition funnel. The suspension turns into a solution upon boiling, after what a solution of N-ethyl-N-isopropylpropane-2-amine in 25 mL ethanol is added dropwise within 20 min. The solution turns from yellow to orange and is heated at reflux for 3 hours. The reaction mixture is cooled down to room temperature during which time a thick yellow precipitate appears.

Work Up

The suspension is poured in 100 mL distilled water and the suspension put in an ice bath and thoroughly stirred. 8 mL acetic acid is then slowly poured in and the suspension is stirred for an additional 30 min. The precipitate is then filtered using a Büchner and washed with salt-free water (200 mL). A beige powder is obtained after overnight drying (drying oven, 40° C.).

Yield: 21.9 g (96%),

Melting point: 124.5° C.

1H-NMR 1H NMR (500 MHz, CDCl3) δ 9.24 (s, 1H), 8.50 (dt, J=2.2, 3.7, 2H), 7.58-7.41 (m, 3H), 3.13 (t, J=6.2, 2H), 2.78-2.62 (m, 2H), 2.30-2.14 (m, 2H).

Second step: Synthesis of 6-benzylidene-2-phenyl-7,8-dihydroquinazolin-5(6H)-one (2). All manipulations were carried out in air, without any further purification of commercial solvents/chemicals.

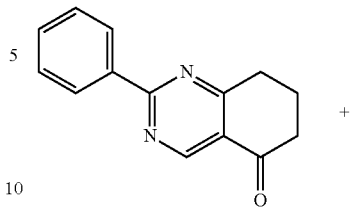
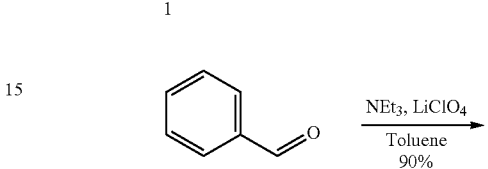
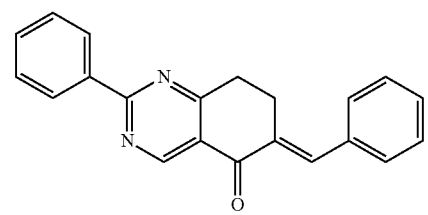

2

| 2-Phenyl-7,8-dihydroquinazoline-5(6H)-one | 5 g (22.5 mmol) |
|---|---|
| Benzaldehyde | 2.5 g (25 mmol) |
| Lithium perchlorate | 2.4 g (22.5 mmol) |
| Triethylamine | 0.3 mL (2 mmol) |
| Toluene | 60 mL |

2-phenyl-7,8-dihydroquinazolin-5(6H)-one (5 g), benzaldehyde (2.5 g) were put in flask in a 50 mL Toluene volume. Triethylamine (0.3 mL) and lithium perchlorate (2.4 g) were then added and the solution was stirred at room temperature for 30 min, after which time a white precipitate appears. The suspension is stirred over night at room temperature and the volatiles were removed using a Rotavapor.

Work Up

The residue was then mixed with 80 mL ethanol and heated to reflux for 10 min. After cooling, the yellow product was then filtered using a Büchner and washed with 20 mL ethanol. The yellow powder is then dried in a vacuum oven overnight (80° C.).

Yield: 6.3 g (90%)

Melting Point: 142° C.

1H NMR (500 MHz, CDCl3) δ 9.36 (s, 1H), 8.63-8.41 (m, 2H), 7.91 (s, 1H), 7.62-7.29 (m, 8H), 3.24 (dd, J=4.1, 9.6, 2H), 3.15 (t, J=6.6, 2H).

Third step: Synthesis of 2,4,8-triphenyl-1,4,5,6-tetrahydropyrimido[4,5-f]quinazoline (3). All manipulations were carried out in air, without any further purification of commercial solvents/chemicals.

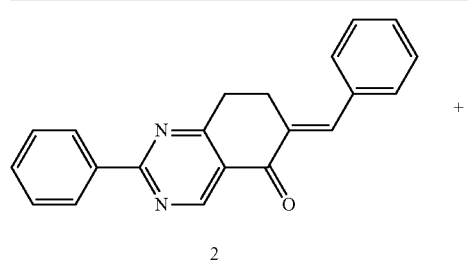 [SMILES: O=C1/C(=C/c2ccccc2)CCc2nc(-c3ccccc3)ncc21]

2

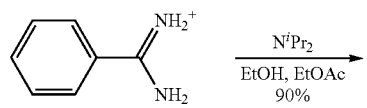

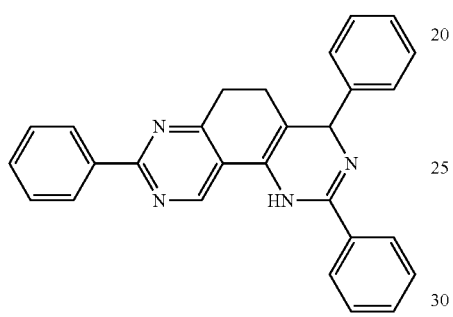

3

| 6-Benzylidene-2-phenyl-7,8-dihydroquinazoline-5(6H)-one | 6.25 g (20 mmol) |
|---|---|
| Benzamidine Hydrochloride | 3.8 g (22 mmol) |
| N-ethyl-N-isopropylpropan-2-amine | 5 mL (29 mmol) |
| Ethanol | 50 mL |
| Ethyl acetate | 50 mL |

6-benzylidene-2-phenyl-7,8-dihydroquinazolin-5(6H)-one (6.25 g) and benzamidine hydrochloride (3.8 g) were allowed to stir in a mixture of Ethanol (30 mL) and ethyl acetate (50 mL). A solution of N-ethyl-N-isopropylpropan-2-amine (5 mL) in 20 mL ethanol is then added within 10 min via an addition. After the addition, the suspension was refluxed for 30 h. After 30 minutes the suspension turned into a solution. After 30 hours, the solution is cooled down, and a yellow precipitate appears.

Work Up 11 ml of acetic acid is then slowly added to the suspension and stirred for 30 minutes at room temperature. The precipitate is filtered using a Büchner and washed with 20 mL ethanol and dried overnight in a vacuum oven.

Yield: 6.05 g (73%).

Melting Point: 200° C.

1H NMR (500 MHz, CDCl3) δ 9.31 (s, 1H), 8.43 (d, J=7.3, 2H), 7.85 (d, J=7.5, 2H), 7.57-7.27 (m, 12H), 5.72 (s, 1H), 5.31 (s, 1H), 3.15-2.84 (m, 2H), 2.49-2.12 (m, 2H).

Fourth step: Synthesis of 2,4,8-triphenylpyrimido[4,5-f]quinazoline (4). All manipulations were carried out in air, without any further purification of commercial solvents/chemicals.

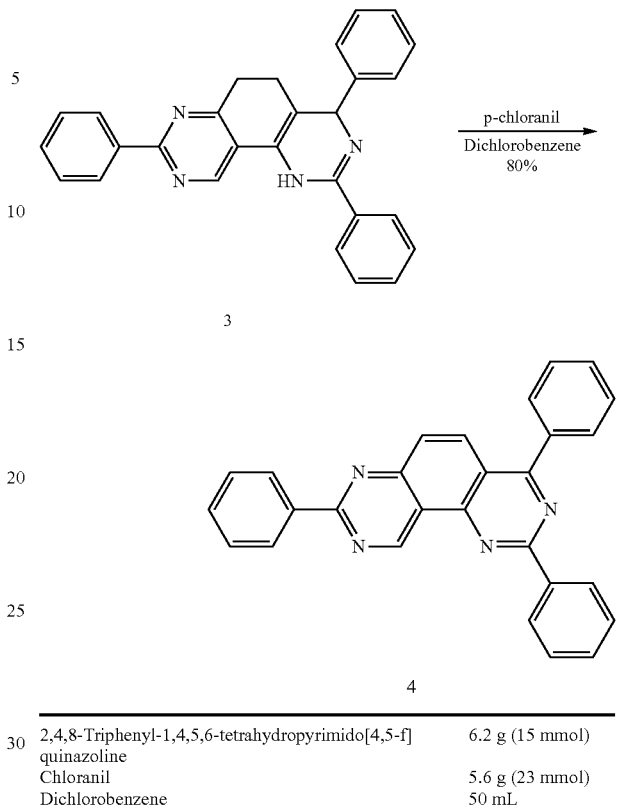

| 2,4,8-Triphenyl-1,4,5,6-tetrahydropyrimido[4,5-f]quinazoline | 6.2 g (15 mmol) |
|---|---|
| Chloranil | 5.6 g (23 mmol) |
| Dichlorobenzene | 50 mL |

2,4,8-triphenyl-1,4,5,6-tetrahydropyrimido[4,5-f]quinazoline (6.2 g) was suspended in 1,2-dichlorobenzene (50 mL) and warmed (60° C.) so that the material gets in solution. Then chloranil (4.1 g) was added portionwise. The solution turns from green to dark yellow. The solution was then refluxed. After 2 h, 0.5 g chloranil was added and after an additional 2 h another 1 g chloranil was finally added. After 9 h reflux, the solution was cooled down and a precipitate appears.

Work Up

The suspension was then added to 30 mL diethylether and stirred for 30 minutes at room temperature. The precipitate was then filtered using a Büchner and washed with 70 mL diethylether.

Yield: 4.9 g (80%)

HPLC purity is calculated using 250 nm as control wavelength. HPLC purity has to be minimum 99.5% otherwise washing step has to be restarted.

Melting Point: 241° C.

Tg: 78° C.

Cyclovoltammetry vs Fc: −2.02V (reversible in THF)

1H NMR (500 MHz, CDCl3) δ 10.85 (s, 1H), 8.83 (dd, J=2.0, 7.6, 2H), 8.75 (dd, J=3.2, 6.6, 2H), 8.45 (d, J=9.3, 1H), 8.04 (d, J=9.3, 1H), 7.91 (dd, J=3.1, 6.4, 2H), 7.69-7.62 (m, 3H), 7.62-7.53 (m, 6H).

Fifth step: Synthesis of 2,4,6,8-Tetraphenyl-9,10-dihydro-1,3,5,7-tetraazaphenanthren (14). All manipulations were carried out under inert atmosphere using freshly distilled solvents.

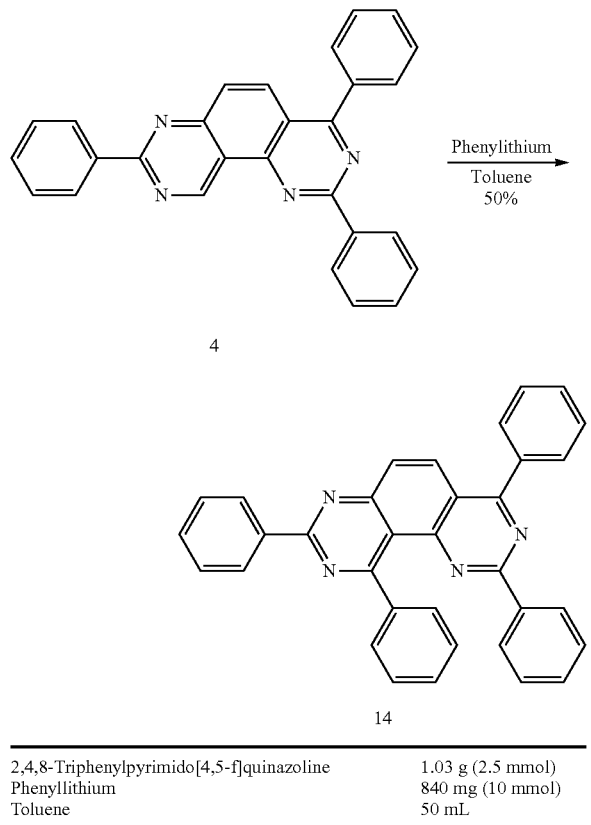

| 2,4,8-Triphenylpyrimido[4,5-f]quinazoline | 1.03 g (2.5 mmol) |
| Phenyllithium | 840 mg (10 mmol) |
| Toluene | 50 mL |

2,4,8-triphenylpyrimido[4,5-f]quinazoline (1.03 g) was suspended in freshly distilled toluene (50 mL). To this suspension was added under inert atmosphere, dropwise, between 2 and 6° C., slowly within 30 minutes, 6 ml of phenyllithium in solution in dibutylether. During the addition, the color of the suspension changes to light yellow and the compounds get in solution. The solution is stirred 16 hours at room temperature.

Work Up

The reaction medium was quenched under water cooling using Methanol (40 mL) added within 15 min. The obtained suspension is concentrated using a rotavapor so that a yellow oil is obtained. The obtained oil is then mixed with 20 ml ethyl acetate and 50 mL diethylether, so that a yellow solid precipitates. The suspension is filtered to obtained 500 mg of an off-white solid which was discarded. The mother liquor was concentrated using a rotavapor and dissolved in 50 ml diethylether. The obtained solution was paper filtered into 120 mL cyclohexane. The obtained solution was distilled at normal pressure to remove diethyl ether. During this process a precipitate appears in the cyclohexane solution. The obtained powder was filtered and dried. 1.4 g yellow powder were obtained.

The yellow powder was dissolved in chloroform (50 mL) and 15 g Manganese dioxide was added. The mixture was stirred during 3 weeks at room temperature before being filtered over a celite pad. The celite pad was washed 3 times with 100 mL chloroform. The filtrate was dried using a rotavapor, then dissolved in 25 ml chloroform before being paper filtered over 250 mL ethanol. The dichloromethane part was removed using a rotavapor. A precipitate appears and is collected by filtration.

Yield: 580 mg (48%).

Melting Point: 237° C.

Tg: 85° C.

Cyclovoltammetry vs Fc: −1.99V (reversible in THF)

$^1$H-NMR (500 MHz, CD$_2$Cl$_2$): δ=8.73 (m, 2H, o-H von 4-Phenyl), 8.39 (d, 1H, J=9.22 Hz, =CH, (H$_{10}$), 8.03 (d, 1H, J=9.22 Hz, =CH, (H$_9$)), 7.89 (m, 2H, o-H von 8-Phenyl), 7.82 (m, 2H, o-H von 2-Phenyl), 7.76 (m, 2H, o-H von 6-Phenyl), 7.68-7.54 (m, 9H, arom. H), 7.43-7.38 (m, 1H, arom. H), 7.33-7.27 (m, 2H, arom. H)

$^{13}$C-NMR (125.7 MHz, CD$_2$Cl$_2$): δ=169.45; 167.66; 162.48; 159.89; 157.43; 151.79; 143.42; 137.82; 137.75; 137.60; 132.09; 131.59; 131.09; 130.62; 130.37; 129.26; 129.04; 128.99; 128.97; 128.83; 128.77; 128.63; 128.45; 120.25; 119.34

Example of a Conductive Layers

The conductivity of a doped layer consisting of material of example 4 doped with 10% of W(hpp)4 was measured at room temperature and was 3.5×10-5 S/cm. The layer remained conductive until the layer temperature reached 120° C.

Example of an Organic Solar Cell

Device 1 (comparative). A state of the art organic solar cell was fabricated with the following procedure: patterned glass substrate coated with ITO was cleaned in an ultrasound bath with etanol, acetone and isopropanol. Afterwards the ITO substrate was exposed to oxygen plasma treatment for 15 minutes. The substrate was loaded into the vacuum trough a glove box with nitrogen. In vacuum the organic layers were deposited with conventional VTE (vacuum thermal evaporation). First a 10 nm thick 5% (molar) p-doped CuPc layer was deposited through a shadow mask over the ITO. A 10 nm undoped CuPc layer was deposited over the doped CuPc layer. A 30 nm thick mixed layer of fullerene C60 and CuPc was deposited with a molar ratio of 2(C60):1(CuPc). A 40 nm thick C60 layer was deposited on top of the mixed layer. A 10 nm BPhen (4,7-diphyenyl-1,10-phenanthroline) layer was deposited on top of the C60 layer. The BPhen layer is followed by a 100 nm thick Al cathode. Under standard simulated AM1.5 normal the device shows a short circuit current of 8 mA/cm^2, a FF of 41% and an open circuit voltage of 0.5 V.

Device 2. An inventive organic solar cell was made with the same layer structure as device 1 except that a 10 nm thick layer of the compound of example 2 was used instead of the BPhen layer. Under standard simulated AM1.5 the device shows a short circuit current of 8.5 mA/cm^2, a FF of 43% and an open circuit voltage of 0.48 V.

Device 3. A comparative organic solar cell was made with the same layer structure as device 1 except that the BPhen layer had a thickness of 15 nm. Under standard simulated AM1.5 the device shows a short circuit current of 7.0 mA/cm^2, a FF of 37% and an open circuit voltage of 0.48 V.

Device 4. An inventive organic solar cell was made with the same layer structure as device 3 except that a 15 nm thick layer of the compound of example 4 was used instead of the BPhen layer. Under standard simulated AM1.5 the device shows a short circuit current of 8.0 mA/cm^2, a FF of 43% and an open circuit voltage of 0.49 V.

It is clearly seen that thicker layers can be made with the inventive compounds.

Both devices 3 and 4 were submitted to thermal stress: the temperature was increased by 1° C. followed by a pause of 20 seconds and an I-V curve measurement. The procedure was repeated increasing the temperature by 1° C. in each step. The device 3 stopped to work at 67° C., the I-V curve turned very flat, the FF dropped to 25%. Device 4 kept working at least until 80° C., after that the measurement was stopped.

Example of an OLED
Device 5

An OLED was fabricated with the following procedure: A glass substrate coated with ITO (90 nm thick, pre-patterned) was cleaned in organic solvents in conventional ultrasound. Afterwards the substrate was treated with ozone plasma for 5 minutes. After the cleaning, the substrate was transferred to vacuum. The organic layers were deposited in high vacuum (base pressure lower than $10^{-3}$ Pa) by conventional VTE (Vacuum thermal evaporation). The deposited area was defined by a shadow mask, keeping some area of the ITO surface free so that an electrical contact for the measurements could (later on) be established. The organic layer sequence over the ITO layer is: 50 nm thick NPD layer doped with 2,2'-(perfluoronaphthalene-2,6-diylidene)dimalononitrile; 10 nm thick non-doped NPD layer, 20 nm thick rubrene emitter layer doped with a fluorescent emitter; 10 nm ETL (structure 8), 60 nm ETL (structure 8) doped with W(hpp)4 (10% in weight). A 100 nm aluminum layer was deposited as cathode. The OLED reached 1000 cd/m$^2$ at 2.9 V.

Device 6

An OLED was fabricated with the following procedure: A glass substrate coated with ITO (90 nm thick, pre-patterned) was cleaned in organic solvents in conventional ultrasound. Afterwards the substrate was treated with ozone plasma for 5 minutes. After the cleaning, the substrate was transferred to vacuum. The organic layers were deposited in high vacuum (base pressure lower than $10^{-3}$ Pa) by conventional VTE (Vacuum thermal evaporation). The deposited area was defined by a shadow mask, keeping some area of the ITO surface free so that an electrical contact for the measurements could (later on) be established. The organic layer sequence over the ITO layer is: 50 nm thick NPD layer doped with 2,2'-(perfluoronaphthalene-2,6-diylidene)dimalononitrile; 10 nm thick non-doped NPD layer, 20 nm thick rubrene emitter layer doped with a fluorescent emitter; 10 nm ETL (structure 4), 60 nm ETL (structure 4) doped with W(hpp)$_4$ (10% in weight). A 100 nm aluminum layer was deposited as cathode. The OLED reached 1000 cd/m$^2$ at 2.7 V.

The features disclosed in the foregoing description and in the claims may, both separately and in any combination thereof, be material for realizing the invention in diverse forms thereof.

The invention claimed is:

1. An organic electronic device comprising an organic semiconducting material, the organic semiconducting material comprising at least one compound according to the following formulae:

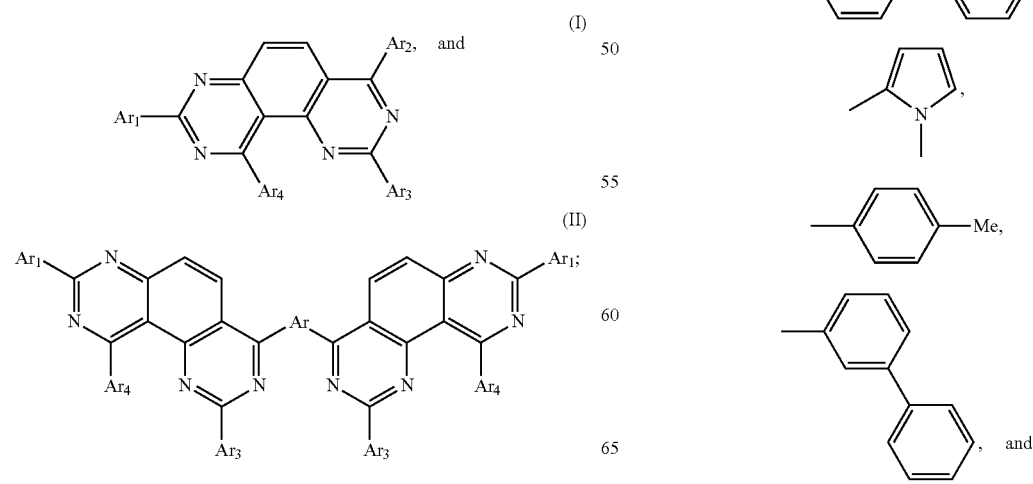

wherein Ar$_1$, Ar$_2$, Ar$_3$, and Ar$_4$ are independently selected from the group consisting of H, halogen, CN, aryl, heteroaryl, alkyl, heteroalkyl, alkoxy, and aryloxy, wherein Ar is selected from the group consisting of aryl, heteroary, alky, and heteroalkyl, and wherein each aryl, heteroaryl, alkyl, heteroalkyl, alkoxy, and aryloxy is independently substituted or unsubstituted.

2. The organic electronic device according to claim 1, wherein the device comprises a layered structure having at least one layer comprising the organic semiconducting material.

3. The organic electronic device according to claim 1, wherein Ar$_1$, Ar$_2$, Ar$_3$, and Ar$_4$ are independently selected from the group consisting of

(a1)

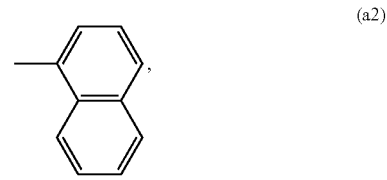

(a2)

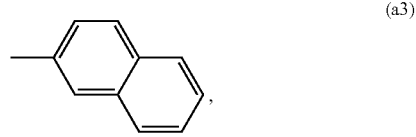

(a3)

(a4)

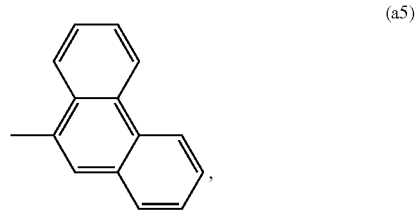

(a5)

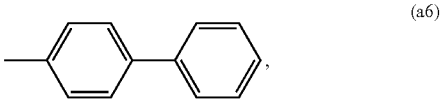

(a6)

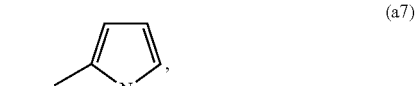

(a7)

(a8)

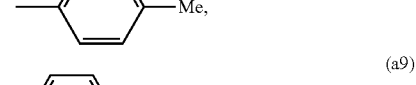

(a9)

and

-continued
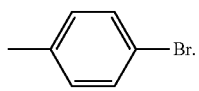  (a10)
4. The organic electronic device according to claim 1, wherein Ar is independently selected from the group consisting of
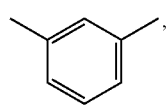  A1
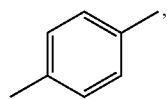  A2
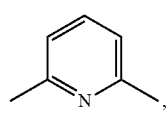  A3
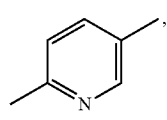  A4
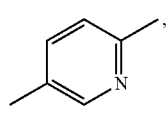  A5
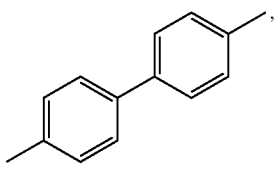  A6
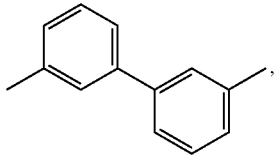  A7
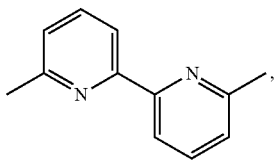  A8
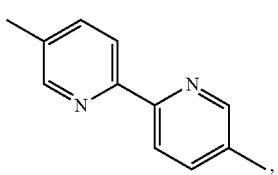  A9
-continued
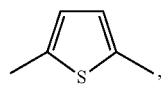  A10
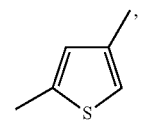  A11
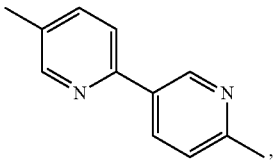  A15
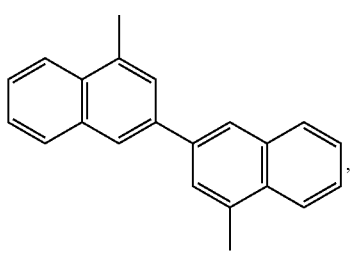  A16
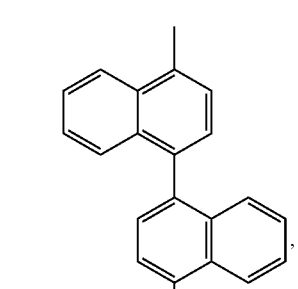  A12
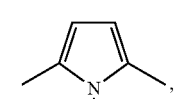  A13
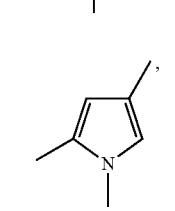  A14
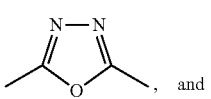  A17
A18
, and -continued

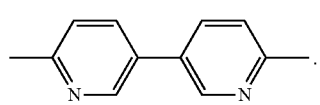

A19

5. The organic electronic device according to claim 1, wherein the device is an electronic, optoelectronic, or electroluminescent device having an electronically functionally effective region, wherein the electronically effective region comprises the organic semiconducting material.

6. The organic electronic device according to claim 1, wherein the device is an organic light-emitting diode, a field-effect transistor, a sensor, a photodetector, an organic solar cell, an organic thin-film transistor, an organic integrated circuit, an organic field-quench device, an organic light-emitting transistor, a light-emitting electrochemical cell, or an organic laser diode.

7. The organic electronic device according to claim 1, wherein the device comprises at least one layer comprising the organic semiconducting material, and wherein the at least one layer comprising the organic semiconducting material is an electron transport layer, a doped electron transport layer, an interlayer, a hole blocking layer, a buffer layer, a doped buffer layer, an emitter matrix, a semiconducting channel layer, an injection layer, a doped injection layer, a pn-transition for combining stacked organic electronic devices, a doped pn-transition for combining stacked organic electronic devices, a charge generation layer, or a recombination layer.

* * * * *